(12) United States Patent
Kang et al.

(10) Patent No.: US 12,268,006 B2
(45) Date of Patent: Apr. 1, 2025

(54) SEMICONDUCTOR DEVICE AND DATA STORAGE SYSTEM INCLUDING THE SAME

(71) Applicant: SAMSUNG ELECTRONICS CO., LTD., Suwon-si (KR)

(72) Inventors: Bosuk Kang, Seoul (KR); Joonhee Lee, Seongnam-si (KR); Seonghun Jeong, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 391 days.

(21) Appl. No.: 17/829,011

(22) Filed: May 31, 2022

(65) Prior Publication Data

US 2023/0081373 A1    Mar. 16, 2023

(30) Foreign Application Priority Data

Sep. 10, 2021   (KR) .................. 10-2021-0120815

(51) Int. Cl.
| | |
|---|---|
| *H01L 27/11575* | (2017.01) |
| *H10B 41/27* | (2023.01) |
| *H10B 41/50* | (2023.01) |
| *H10B 43/27* | (2023.01) |
| *H10B 43/50* | (2023.01) |

(52) U.S. Cl.
CPC ............. *H10B 43/50* (2023.02); *H10B 41/27* (2023.02); *H10B 41/50* (2023.02); *H10B 43/27* (2023.02)

(58) Field of Classification Search
CPC ........ H10B 43/50; H10B 41/27; H10B 41/50; H10B 43/27; H10B 43/10; H10B 41/10
See application file for complete search history.

(56) References Cited

U.S. PATENT DOCUMENTS

| | | |
|---|---|---|
| 9,812,461 B2 | 11/2017 | Doda et al. |
| 2013/0256775 A1 | 10/2013 | Shim et al. |
| 2018/0240811 A1 | 8/2018 | Kim et al. |
| 2020/0035702 A1 | 1/2020 | Lee et al. |
| 2020/0303413 A1 | 9/2020 | Shin et al. |
| 2020/0312861 A1* | 10/2020 | Kim .................. H10B 43/27 |

FOREIGN PATENT DOCUMENTS

| | | |
|---|---|---|
| KR | 20180096878 A | 8/2018 |
| KR | 20200011852 A | 2/2020 |

* cited by examiner

*Primary Examiner* — Ermias T Woldegeorgis
(74) *Attorney, Agent, or Firm* — Myers Bigel, P.A.

(57) ABSTRACT

A semiconductor device includes a substrate having a first region and a second region, gate electrodes spaced apart from each other in a first direction, perpendicular to an upper surface of the substrate, and extend in a second direction, and have different lengths on the second region, channel structures that penetrate the gate electrodes, extend in the first direction, and respectively include a channel layer on the first region, support structures that penetrate the gate electrodes and extend in the first direction on the second region, and a separation region that penetrates the gate electrodes and extend in the second direction. The substrate has a recess region that overlaps the separation region in the first direction and extends downward from an upper surface in the second region, adjacent to the first region. The separation region has a protrusion that protrudes downward to correspond to the recess region.

20 Claims, 31 Drawing Sheets

SEMICONDUCTOR DEVICE AND DATA STORAGE SYSTEM INCLUDING THE SAME

CROSS-REFERENCE TO RELATED APPLICATION(S)

This application claims benefit of priority to Korean Patent Application No. 10-2021-0120815 filed on Sep. 10, 2021 in the Korean Intellectual Property Office, the disclosure of which is incorporated herein by reference in its entirety.

BACKGROUND

The present inventive concept relates to a semiconductor device and a data storage system including the same.

A semiconductor device capable of storing high-capacity data in a data storage system requiring data storage may be needed. Accordingly, a method for increasing a data storage capacity of semiconductor devices has been studied. For example, for increasing the data storage capacity of semiconductor devices, a semiconductor device including memory cells arranged three-dimensionally, instead of two-dimensionally arranged memory cells, has been proposed.

SUMMARY

An aspect of the present inventive concept is to provide a semiconductor device having improved reliability.

Another aspect of the present inventive concept is to provide a data storage system including a semiconductor device having improved reliability.

According to example embodiments, a semiconductor device may include a first semiconductor structure having a first substrate and circuit elements on the first substrate, and a second semiconductor structure on the first semiconductor structure. The second semiconductor structure may include a second substrate including a first region and a second region, gate electrodes that are stacked and spaced apart from each other in a first direction that is perpendicular to an upper surface of the second substrate. The gate electrodes extend in a second direction on the second region and have different lengths on the second region. The second semiconductor structure may include channel structures that penetrate the gate electrodes, extend in the first direction, and each of the channel structures includes a conductive channel layer, and the channel structures are on the first region. The second semiconductor structure may include support structures that penetrate the gate electrodes, extend in the first direction, and each of the support structures includes a support insulating layer, and the support structures are on the second region. The second semiconductor structure may include separation regions that penetrate the gate electrodes, extend in the second direction, and are spaced apart from each other in a third direction that is perpendicular to the first direction and the second direction The second semiconductor structure may include a first horizontal conductive layer on the first region below the gate electrodes and is in contact with the channel layer of each of the channel structures. The second semiconductor structure may include a horizontal insulating layer below the gate electrodes on a portion of the second region. The second substrate has recess regions below the separation regions in the second region, adjacent to the first region.

According to example embodiments, a semiconductor device may include a substrate having a first region and a second region, gate electrodes that are stacked and spaced apart from each other in a first direction that is perpendicular to an upper surface of the substrate. The gate electrodes extend in a second direction on the second region and have different lengths on the second region. The semiconductor structure may include channel structures that penetrate the gate electrodes, extend in the first direction, and each of the channel structures includes a channel layer, and the channel structures are on the first region. The semiconductor structure may include support structures that penetrate the gate electrodes and extend in the first direction on the second region, and a separation region that penetrates the gate electrodes and extends in the second direction. The substrate has a recess region that overlaps the separation region in the first direction and extends downward from the upper surface in the second region. The separation region has a protrusion that protrudes downward to correspond to the recess region.

According to example embodiments, a data storage system may include a semiconductor storage device including a substrate having a first region and a second region, circuit elements on one side of the substrate, and an input/output (I/O) pad electrically connected to the circuit elements, and a controller electrically connected to the semiconductor storage device through the I/O pad and controlling the semiconductor storage device. The semiconductor storage device further includes gate electrodes that are stacked and spaced apart from each other in a first direction that is perpendicular to an upper surface of the substrate. The gate electrodes extend in a second direction on the second region and have different lengths on the second region. The semiconductor storage device may include channel structures that penetrate the gate electrodes and extend in the first direction. Each of the channel structures includes a channel layer, and the channel structures are on the first region. The semiconductor storage device may include support structures that penetrate the gate electrodes and extend in the first direction, and the support structures are on the second region. The semiconductor storage device may include a separation region that penetrates the gate electrodes and extends in the second direction. The substrate has a recess region that overlaps the separation region in the first direction and extends downward from the upper surface of the substrate in the second region. The separation region has a protrusion that protrudes downward towards the recess region.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

Figure 1:
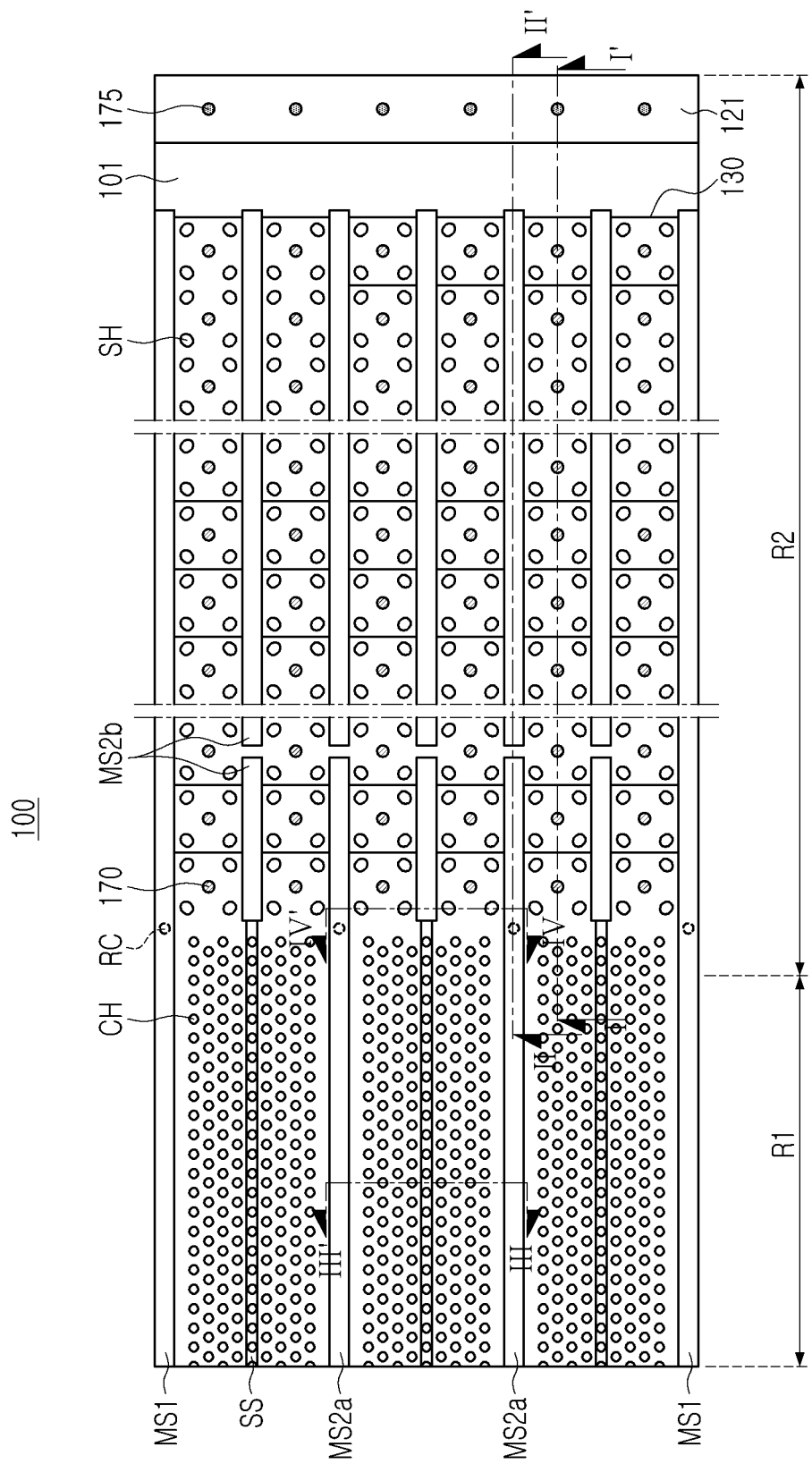
FIG. 1 is a schematic plan view of a semiconductor device according to example embodiments.

FIG. 1 is a schematic plan view of a semiconductor device according to example embodiments.

FIGS. 2A to 2D are schematic cross-sectional views of semiconductor devices according to example embodiments. FIGS. 2A to 2D illustrate cross-sections taken along lines I-I', and IV-IV' of FIG. 1, respectively.

Figure 2A:
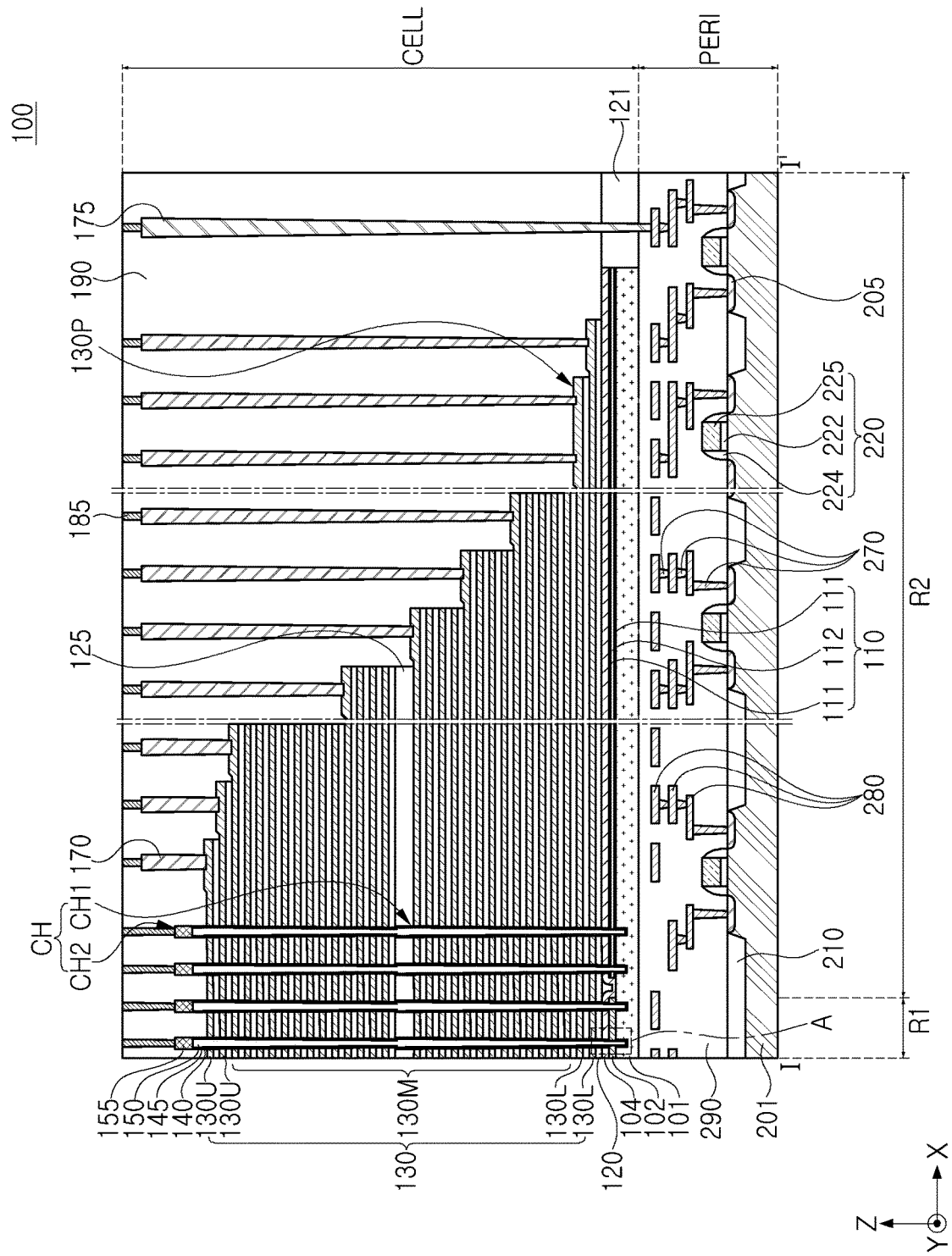
FIGS. 2A to 2D are schematic cross-sectional views of semiconductor devices according to example embodiments.
Figure 2B:
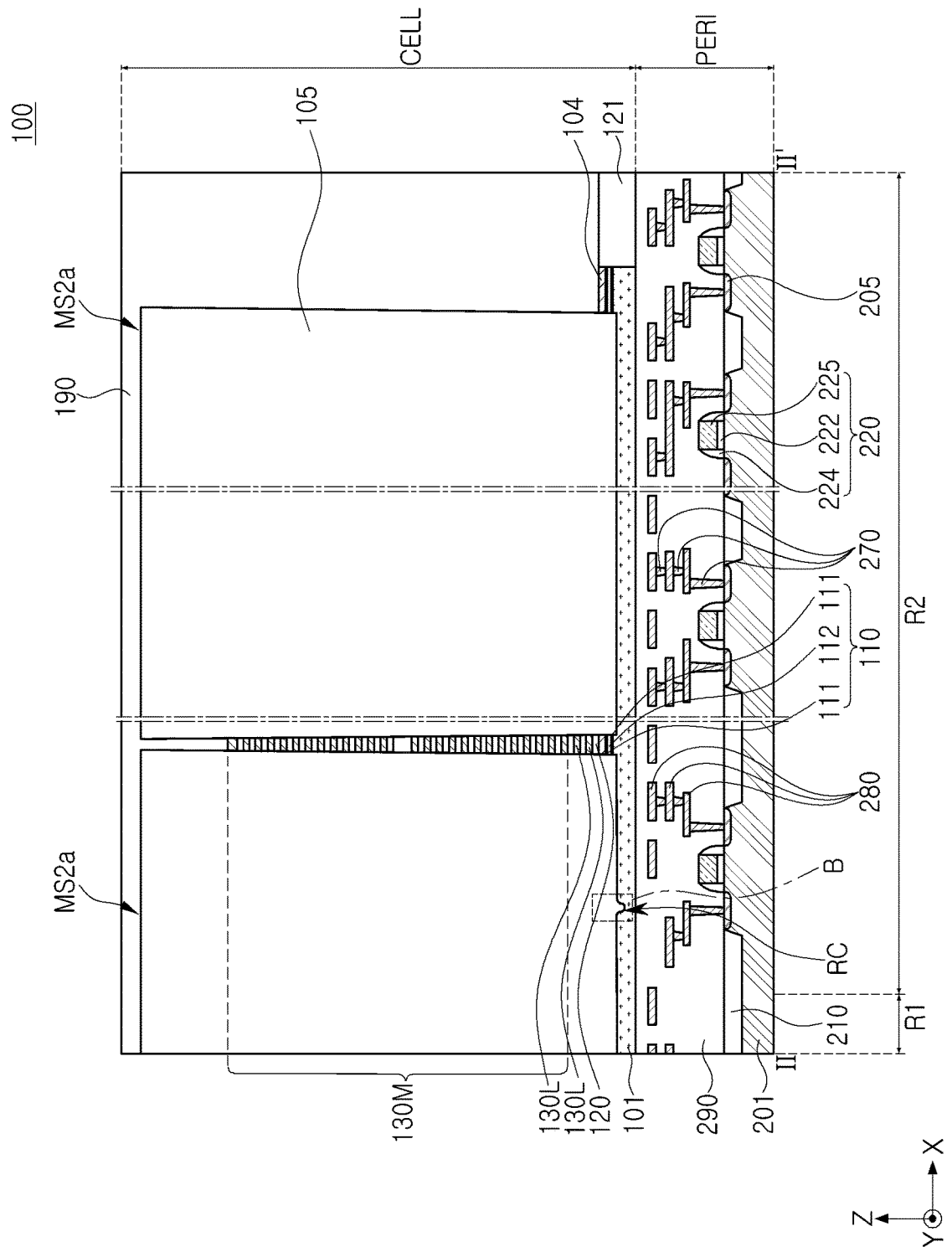
Figure 3:
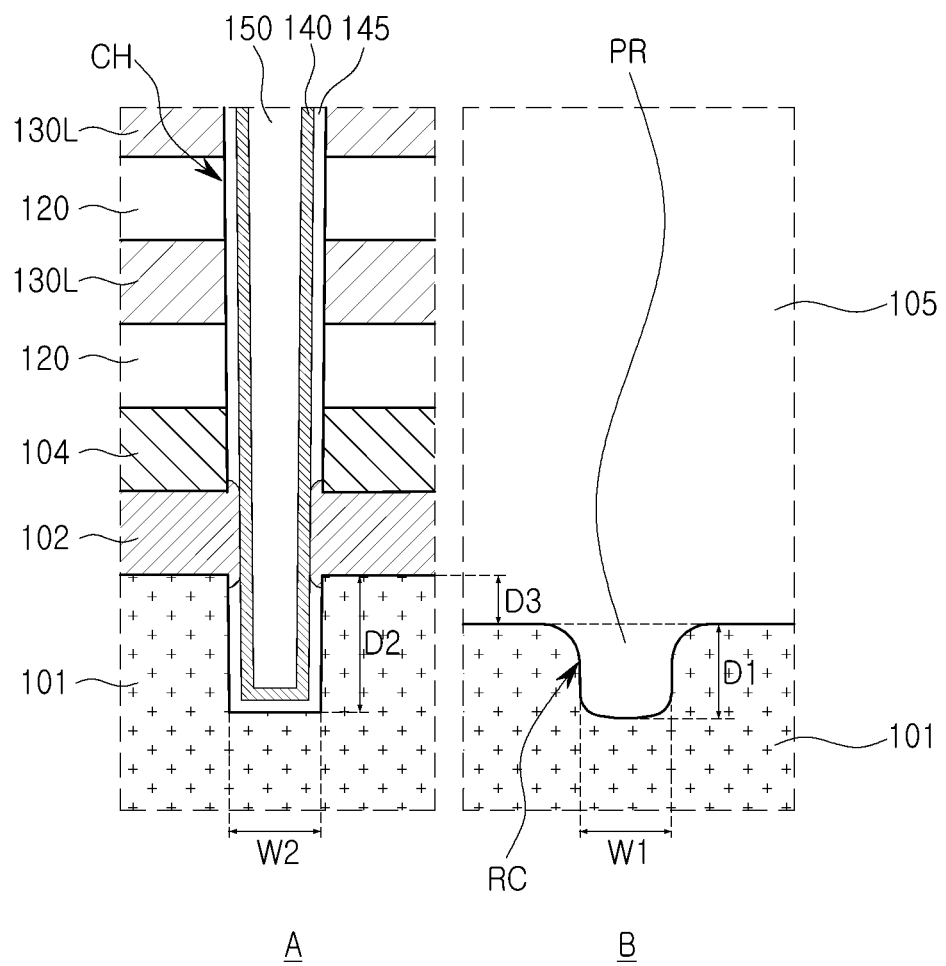
FIG. 3 is a partially enlarged view illustrating partial regions of a semiconductor device according to example embodiments.

FIG. 3 is a partially enlarged view illustrating partial regions of a semiconductor device according to example embodiments. In FIG. 3, a region 'A' of FIG. 2A and a region 'B' of FIG. 2B are illustrated to be enlarged.

Referring to FIGS. 1 to 3, the semiconductor device 100 may include a peripheral circuit region PERI, which may be a first semiconductor structure including a first substrate 201, and a cell region CELL, which may be a second semiconductor structure including a second substrate 101. The memory cell region CELL may be disposed on the peripheral circuit region PERI. Conversely, in example embodiments, the cell region CELL may be disposed below the peripheral circuit region PERI.

The peripheral circuit region PERI may include a first substrate 201, source/drain regions 205 and device isolation layers 210 in the first substrate 201, circuit elements 220 disposed on the first substrate 201, circuit contact plugs 270, circuit interconnection lines 280, and a peripheral region insulating layer 290.

The first substrate 201 may have an upper surface extending in an X-direction and the Y-direction. An active region may be defined in the first substrate 201 by the device isolation layers 210. Source/drain regions 205 including impurities may be disposed in a portion of the active region. The first substrate 201 may include a semiconductor material, for example, a group IV semiconductor, a group III-V compound semiconductor, or a group II-VI compound semiconductor. The first substrate 201 may be provided as a bulk wafer or an epitaxial layer.

The circuit elements 220 may include planar transistors. Each of the circuit elements 220 may include a circuit gate dielectric layer 222, a spacer layer 224, and a circuit gate electrode 225. The source/drain regions 205 may be disposed in the first substrate 201 on both sides of the circuit gate electrode 225.

The circuit contact plugs 270 and the circuit interconnection lines 280 may form a circuit wiring structure electrically connected to the circuit elements 220 and the source/drain regions 205. The circuit contact plugs 270 may have a cylindrical shape, and the circuit interconnection lines 280 may have a line shape. The circuit contact plugs 270 and the circuit interconnection lines 280 may include a conductive material, for example, tungsten (W), copper (Cu), aluminum (Al), or the like, and each thereof may further include a diffusion barrier. However, in example embodiments, the number of layers and the arrangement of the circuit contact plugs 270 and the circuit interconnection lines 280 may be variously changed.

The peripheral region insulating layer 290 may be disposed on the first substrate 201 to cover or overlap the circuit elements 220. The peripheral region insulating layer 290 may be formed of an insulating material and may include one or more insulating layers.

The memory cell region CELL may include a second substrate 101 having a first region R1 and a second region R2, gate electrodes 130 stacked on the second substrate 101, interlayer insulating layers 120 alternately stacked with the gate electrodes 130, channel structures CH disposed to penetrate through a stack structure of the gate electrodes 130 in portions of the first region R1 and the second region R2, support structures SH disposed to penetrate through the stack structure of the gate electrodes 130 in a portion of the second region R2, first and second separation regions MS1, MS2a, and MS2b extending to penetrate through the stack structure of the gate electrodes, and contact plugs 170 connected to pad regions 130P of the gate electrodes 130 and extend vertically in the second region R2.

The memory cell region CELL may further include a substrate insulating layer 121, first and second horizontal conductive layers 102 and 104 disposed below the gate electrodes 130 on the first region R1, a horizontal insulating layer 110 disposed below the gate electrodes 130 on the second region R2, upper separation regions SS penetrating through some of the gate electrodes 130, through-vias 175 extending into the peripheral circuit region PERI from the memory cell region CELL, upper interconnections 185 on the channel structures CH and the contact plugs 170, and a cell region insulating layer 190 covering or overlapping the gate electrodes 130.

The first region R1 of the second substrate 101 may be a region in which the gate electrodes 130 are vertically stacked and the channel structures CH may be disposed, and may be a region in which memory cells may be disposed. The second region R2 of the second substrate 101 may be a region in which the gate electrodes 130 extend to have different lengths, and may correspond to a region for electrically connecting the memory cells to the peripheral circuit region PERI. The second region R2 may be disposed at one end of the first region R1 in at least one direction, for example, the X-direction. The second substrate 101 may have a plate layer shape and may function as at least a portion of a common source line of the semiconductor device 100.

The second substrate 101 may have an upper surface extending in the X-direction and the Y-direction. The second substrate 101 may include a semiconductor material, for example, a group IV semiconductor, a group III-V compound semiconductor, or a group II-VI compound semiconductor. For example, the group IV semiconductor may include silicon, germanium, or silicon-germanium. The second substrate 101 may further include impurities. The second substrate 101 may be provided as a polycrystalline semiconductor layer such as a polycrystalline silicon layer or an epitaxial layer.

In the second region R2 adjacent to the first region R1, the second substrate 101 may have recess regions RC disposed to vertically overlap the first separation regions MS1 and the second central separation regions MS2a. The recess regions RC may be regions formed as the channel structures CH are formed and then removed. The recess regions RC may entirely overlap the first separation regions MS1 and the second central separation regions MS2a. The recess regions RC may be formed on an upper surface of the second substrate 101 below the first separation regions MS1 and the second central separation region MS2a. The recess regions RC may be disposed in a region between the channel structures CH and the support structures SH in the X-direction, as shown in FIG. 1. Specifically, the recess regions RC may be disposed in a region between the channel structures CH and the support structures SH in the X-direction, and may be disposed in a region shifted from the channel structures CH and the support structures in the Y-direction. The recess regions RC may be disposed to be spaced apart from the first horizontal conductive layer 102 disposed in the first region R1 in the X-direction and the Y-direction.

As shown in FIGS. 2B and 3, the recess regions RC may convexly protrude downward from the upper surface of the second substrate 101 toward a lower surface of the second substrate 101. Protrusions PR of the first separation regions MS1 and the second central separation region MS2a are positioned in the recess regions RC and may be filled with the isolation insulating layer 105.

A level of a lower end of the recess region RC may be the same as or lower than a level of a lower end of the channel structure CH. This is because the recess region RC is a region formed by forming and then removing a channel structure having the same size as that of the channel structure CH. As illustrated in FIG. 3, the recess region RC may have a first depth D1 from a lower surface of the second central separation region MS2a. The first depth D1 may correspond to a depth from the recessed upper surface of the second substrate 101 to the lower end of the recessed region RC. The first depth D1 may range, for example, from about 70 nm to about 150 nm.

In some embodiments, the first depth D1 may be less than a second depth D2 at which the channel structure CH recesses the second substrate 101. This is because the second central separation region MS2a and the like are formed by recessing the second substrate 101 by a third depth D3. Accordingly, the second depth D2 may be equal to or less than the sum of the first depth D1 and a third depth D3. However, in some embodiments, the second central separation region MS2a or the like may be disposed so as not to recess the second substrate 101.

The recess regions RC may have a shape corresponding to the channel structures CH on an X-Y plane. For example, the recess regions RC may have a circular shape like the channel structures CH. As illustrated in FIG. 3, a first diameter W1 of the recess region RC may be equal to or greater than a second diameter W2 of the channel structure CH on the same level. In this disclosure, "diameter" may be interpreted as a maximum width when a shape of an object configuration is not circular. The first diameter W1 and the second diameter W2 may be less than a diameter of the support structure SH. In example embodiments, when a level of the lower end of the recess regions RC is lower than a level of the lower end of the channel structures CH, the diameter of the recess regions RC at the lower end may be less than a diameter of the channel structures CH at the lower end, but the present inventive concept is not limited thereto.

The first and second horizontal conductive layers 102 and 104 may be sequentially stacked and disposed on an upper surface of the first region R1 of the second substrate 101. The first horizontal conductive layer 102 may not extend to the second region R2 of the second substrate 101, and the second horizontal conductive layer 104 may extend to the second region R2. The first horizontal conductive layer 102 may function as a portion of a common source line of the semiconductor device 100, for example, as a common source line together with the second substrate 101. As shown in the enlarged view of FIG. 3, the first horizontal conductive layer 102 may be directly connected to the channel layer 140 and may surround the channel layer 140 in a plan view.

The second horizontal conductive layer 104 may be in contact with the second substrate 101 in partial regions of the second region R2 in which the first horizontal conductive layer 102 and the horizontal insulating layer 110 are not disposed. The first horizontal conductive layer 102 may extend into the second substrate 101 such that a lower portion of the first horizontal conductive layer 102 is lower that the top surface of the second substrate 101. The second horizontal conductive layer 104 may cover or overlap an end of the first horizontal conductive layer 102 or the horizontal insulating layer 110 in the partial regions, and may be bent to extend onto the second substrate 101. An upper portion of the first horizontal conductive layer 102 may extend into a space between the second horizontal conductive layer 104 and the channel layer 140 such that an upper portion of the first horizontal conductive layer 102 is higher than the bottom surface of the second horizontal conductive layer 104. The partial regions may be regions in contact with outer surfaces of the first and second separation regions MS1, MS2a and MS2b in the second region R2 and surrounding the first and second separation regions MS1, MS2a and MS2b but may not be limited thereto.

The first and second horizontal conductive layers 102 and 104 may include a semiconductor material, such as polycrystalline silicon. In this case, at least the first horizontal conductive layer 102 may be a layer doped with impurities of the same conductivity type as that of the second substrate 101, and the second horizontal conductive layer 104 may be a doped layer or a layer including an impurity diffused from the first horizontal conductive layer 102. However, a material of the second horizontal conductive layer 104 may not be limited to the semiconductor material, and may be replaced with an insulating layer.

The horizontal insulating layer 110 may be disposed on the second substrate 101 on the same level as that of the first horizontal conductive layer 102 in at least a portion of the second region R2. The horizontal insulating layer 110 may include first and second horizontal insulating layers 111 and 112 alternately stacked on the second region R2 of the second substrate 101. The horizontal insulating layer 110 may be layers remaining after a portion thereof is replaced with the first horizontal conductive layer 102 in a manufacturing process of the semiconductor device 100.

The horizontal insulating layer 110 may include silicon oxide, silicon nitride, silicon carbide, or silicon oxynitride. The first horizontal insulating layers 111 and the second horizontal insulating layer 112 may include different insulating materials. For example, the first horizontal insulating layers 111 may be formed of the same material as that of the interlayer insulating layers 120, and the second horizontal insulating layer 112 may be formed of a material different from that of the interlayer insulating layers 120.

The substrate insulating layer 121 may be disposed to penetrate through the second substrate 101, the horizontal insulating layer 110, and the second horizontal conductive layer 104 outside the second region R2. The substrate insulating layer 121 may be further disposed in the first region R1 and the second region R2, for example, in a region in which the through-vias 175 are disposed. A lower surface of the substrate insulating layer 121 may be coplanar with the lower surface of the second substrate 101 or may be positioned on a level lower than the lower surface of the second substrate 101. The substrate insulating layer 121 may include an insulating material, for example, silicon oxide, silicon nitride, silicon carbide, or silicon oxynitride.

The gate electrodes 130 may be vertically spaced apart and stacked on the second substrate 101 to form a stack structure. The gate electrodes 130 may include a lower gate electrode 130L forming a gate of a ground selection transistor, memory gate electrodes 130M forming a plurality of memory cells, and upper gate electrodes 130U forming gates of string select transistors. The number of memory gate electrodes 130M that make up memory cells may be determined according to capacity of the semiconductor device 100. According to some embodiments, each of the upper and lower gate electrodes 130U and 130L may be one or two or more, and may have a structure the same as or different from that of the memory gate electrodes 130M. In example embodiments, the gate electrodes 130 may further include a gate electrode 130 forming an erase transistor disposed above the upper gate electrodes 130U and/or below the lower gate electrode 130L and used in an erase operation using a gate induced drain leakage (GIDL) phenomenon. Also, some of the gate electrodes 130, for example, the memory gate electrodes 130M adjacent to the upper or lower gate electrodes 130U and 130L may be dummy gate electrodes.

As shown in FIG. 1, the gate electrodes 130 may be disposed to be separated from each other in the Y-direction by the first separation regions MS1 continuously extending from the first region R1 and the second region R2. The gate electrodes 130 between a pair of first separation regions MS1 may form one memory block, but a range of the memory block is not limited thereto. Some of the gate electrodes 130, for example, the memory gate electrodes 130M, may each form one layer in one memory block.

The gate electrodes 130 may be vertically spaced apart from each other and stacked on the first region R1 and the second region R2, and extend to have different lengths from the first region R1 to the second region R2 to form a step structure to have a shape of stairs in a portion of the second region R2. The gate electrodes 130 may be disposed to have a step structure from each other in the Y-direction. Due to the step structure, in the gate electrodes 130, the lower gate electrode 130 may extend longer than the upper gate electrode 130 so that upper surfaces thereof may have regions exposed upwardly from the interlayer insulating layers 120 and the other gate electrodes 130, and these regions may be referred to as pad regions 130P. In each gate electrode 130, the pad region 130P may be a region including an end of the gate electrode 130 in the X-direction. The pad region 130P may correspond to a region of the gate electrode 130 positioned at the top in each region among the gate electrodes 130 constituting the stack structure in the second region R2 of the second substrate 101. The gate electrodes 130 may be respectively connected to the contact plugs 170 in the pad regions 130P. The gate electrodes 130 may have an increased thickness in the pad regions 130P.

The gate electrodes 130 may include a metal material, for example, tungsten (W). In some embodiments, the gate electrodes 130 may include polycrystalline silicon or a metal silicide material. In example embodiments, the gate electrodes 130 may further include a diffusion barrier and, for example, the diffusion barrier may include tungsten nitride (WN), tantalum nitride (TaN), titanium nitride (TiN), or a combination thereof.

The interlayer insulating layers 120 may be disposed between the gate electrodes 130. Like the gate electrodes 130, the interlayer insulating layers 120 may be spaced apart from each other in a direction, perpendicular to the upper surface of the second substrate 101, and may be disposed to extend in the X-direction. The interlayer insulating layers 120 may include an insulating material such as silicon oxide or silicon nitride.

The first and second separation regions MS1, MS2a, and MS2b may be disposed to extend in the X-direction through the gate electrodes 130. The first and second separation regions MS1, MS2a, and MS2b may be disposed parallel to each other. The first and second separation regions MS1, MS2a, and MS2b may penetrate through some or all of the gate electrodes 130 stacked on the second substrate 101 and may be connected to the second substrate 101 further through the first and second horizontal conductive layers 102 and 104 and the horizontal insulating layer 110. The first separation regions MS1 may extend integrally in the X-direction, and the second separation regions MS2 may intermittently extend between the pair of first separation regions MS1 or may only be disposed in some regions. For example, the second central separation regions MS2a may extend integrally in the first region R1 and intermittently extend in the second region R2 in the X-direction. The second auxiliary separation regions MS2b may only be disposed in the second region R2 and may intermittently extend in the X-direction. However, in some embodiments, the arrangement order and number of the first and second separation regions MS1, MS2a, and MS2b are not limited to those illustrated in FIG. 1.

An isolation insulating layer 105 may be disposed in the first and second separation regions MS1, MS2a, and MS2b. The isolation insulating layer 105 may have a shape having a width decreased toward the second substrate 101 due to a high aspect ratio, but is not limited thereto, and the isolation insulating layer 105 may have a side surface, perpendicular to the upper surface of the second substrate 101. A lower surface of the isolation insulating layer 105 may be in contact with the second substrate 101.

The isolation insulating layer 105 forming the first separation regions MS1 and second central separation regions MS2a extending from the first region R1 to the second region R2, among the first and second separation regions MS1, MS2a, and MS2b, may have protrusions PR protruding downward from a lower surface to correspond to the recess regions RC. The protrusion PR may extend into the second substrate 101. Accordingly, the lower surface of the isolation insulating layer 105 may be in contact with the second substrate 101 and may have a curve. A depth of the protrusion PR may correspond to the first depth D1 mentioned above. The isolation insulating layer 105 may include an insulating material, for example, silicon oxide, silicon nitride, and/or silicon oxynitride.

As illustrated in FIG. 1, the upper separation regions SS may extend in the X-direction between the first separation regions MS1 and the second central separation region MS2a and between the second central separation regions MS2a, in the first region R1. The upper separation regions SS may be disposed in a portion of the second region R2 and in the first region R1 and penetrate through some of the gate electrodes 130 including the uppermost upper gate electrode 130U among the gate electrodes 130. As illustrated in FIG. 2C, the upper separation regions SS may separate, for example, a total of three gate electrodes 130 from each other in the Y-direction. However, the number of gate electrodes 130 separated by the upper separation regions SS may be variously changed in some embodiments. The upper separation regions SS may include an upper isolation insulating layer 103. The upper isolation insulating layer 103 may include an insulating material, for example, silicon oxide, silicon nitride, or silicon oxynitride.

Each of the channel structures CH may form one memory cell string, and may be disposed to be spaced apart from each other while forming rows and columns on the first region R1. The channel structures CH may be disposed to form a grid pattern in an X-Y plane or may be disposed in a zigzag shape in one direction. The channel structures CH may have a columnar shape, and may have inclined side surface narrower toward the second substrate 101 according to an aspect ratio. The channel structures CH disposed in the second region R2 may be dummy channels that do not substantially form a memory cell string. In some embodiments, at least some of the channel structures CH disposed at the end of the first region R1 may also be dummy channels.

The channel structures CH may include vertically stacked first and second channel structures CH1 and CH2. The channel structures CH may have a shape in which the lower first channel structures CH1 and the upper second channel structures CH2 are connected to each other, and may have a bent portion due to a difference in width in a connection region. However, according to embodiments, the number of channel structures stacked in the Z-direction may be variously changed.

Each of the channel structures CH may include a channel layer 140, a gate dielectric layer 145, a channel filling insulating layer 150, and a channel pad 155 disposed in a channel hole. As shown in the enlarged view of FIG. 3, the channel layer 140 may be formed in an annular shape surrounding the channel filling insulating layer 150 therein, but according to some embodiments, the channel layer 140 may have a columnar shape such as a cylinder or a prism. The channel layer 140 may be connected to the first horizontal conductive layer 102 at a lower portion thereof. The channel layer 140 may include a semiconductor material such as polycrystalline silicon or single crystal silicon.

The gate dielectric layer 145 may be disposed between the gate electrodes 130 and the channel layer 140. Although not specifically illustrated, the gate dielectric layer 145 may include a tunneling layer, a charge storage layer, and/or a blocking layer sequentially stacked from the channel layer 140. The tunneling layer may tunnel charges into the charge storage layer, and may include, for example, silicon oxide ($SiO_2$), silicon nitride ($Si_3N_4$), silicon oxynitride (SiON), or a combination thereof. The charge storage layer may be a charge trap layer or a floating gate conductive layer. The blocking layer may include silicon oxide ($SiO_2$), silicon nitride ($Si_3N_4$), silicon oxynitride (SiON), a high-k dielectric material, or a combination thereof. In example embodiments, at least a portion of the gate dielectric layer 145 may extend in a horizontal direction along the gate electrodes 130.

The channel pad 155 may be disposed only at an upper end of the upper second channel structure CH2. The channel pad 155 may include, for example, doped polycrystalline silicon.

The channel layer 140, the gate dielectric layer 145, and the channel filling insulating layer 150 may be connected to each other between the first channel structure CH1 and the second channel structure CH2. A relatively thick upper interlayer insulating layer 125 may be disposed between the first channel structure CH1 and the second channel structure CH2. However, the thickness and shape of the interlayer insulating layers 120 and the upper interlayer insulating layer 125 may be variously changed in some embodiments.

The support structures SH may be disposed to be spaced apart from each other, while forming rows and columns in the second region R2. As shown in FIG. 1, the support structures SH may be disposed to surround each of the contact plugs 170 in four directions. However, in some embodiments, the arrangement of the support structures SH may be variously changed. The support structures SH may have a columnar shape, and may have an inclined side surface narrower toward the second substrate 101 according to an aspect ratio.

The support structures SH may include vertically stacked first and second support structures SH1 and SH2. The support structures SH may have a form in which lower first support structures SH1 and upper support structures SH2 are connected to each other, and may have a bent portion due to a difference in width in a connection region. However, according to some embodiments, the number of support structures stacked in the Z-direction may be variously changed. A diameter or a maximum width of the support structures SH may be greater than that of the channel structures CH. The support structures SH may have a circular shape, an elliptical shape, or a shape similar thereto in the X-Y plane.

The support structures SH may have an internal structure different from the channel structures CH. The support structures SH may not include a conductive layer, and may include a support insulating layer 160 disposed in each support hole. The support insulating layer 160 may include an insulating material, for example, silicon oxide, silicon nitride, and/or silicon oxynitride.

The contact plugs 170 may be connected to the pad regions 130P of the uppermost gate electrodes 130 in the second region R2. The contact plugs 170 may penetrate through at least a portion of the cell region insulating layer 190 and may be connected to each of the pad regions 130P of the gate electrodes 130 exposed upwardly. The contact plugs 170 may further include a substrate contact plug connected to the second substrate 101. In other embodiments, the contact plugs 170 may penetrate through the gate electrodes 130 below the pad regions 130P and may penetrate through the horizontal insulating layer 110, the second horizontal conductive layer 104, and the second horizontal conductive layer 104 to be connected to the circuit interconnection lines 280 in the peripheral circuit region PERI. In this case, the contact plugs 170 may be spaced apart from the gate electrodes 130 below the pad regions 130P by a separate insulating layer, and may also be spaced apart from the second horizontal conductive layer 104 and the second substrate 101.

The contact plugs 170 may include a conductive material, for example, at least one of tungsten (W), copper (Cu), aluminum (Al), and/or alloys thereof. In some embodiments, the contact plugs 170 may have an air gap therein.

The through-vias 175 may be disposed outside the second substrate 101 and may extend through the memory cell region CELL to the peripheral circuit region PERI. The through-vias 180 may be disposed to connect the upper interconnections 185 of the memory cell region CELL and the circuit interconnection lines 280 of the peripheral circuit region PERI. However, in some embodiments, the through-vias 175 may be disposed to penetrate through the stack structure of sacrificial insulating layers 118 (refer to FIG. 9A) and the interlayer insulating layers 120 in a region in which the sacrificial insulating layers 118 that are not replaced with the gate electrodes 130 remain. The through-vias 175 may include a conductive material, for example, at least one of tungsten (W), copper (Cu), aluminum (Al), and/or alloys thereof.

The upper interconnections 185 may form a cell interconnection structure electrically connected to memory cells in the memory cell region CELL. The upper interconnections 185 may be connected to the channel structures CH, the contact plugs 170, and the through-vias 175, and may be electrically connected to the channel structures CH and the gate electrodes 130. Although the upper interconnections 185 are illustrated in the form of a plug, the upper interconnections are not limited thereto and may have a line form. In example embodiments, the number of plugs and interconnection lines constituting the cell interconnection structure may be variously changed. The upper interconnections 185 may include metal, for example, tungsten (W), copper (Cu), aluminum (Al), and/or the like.

The cell region insulating layer 190 may be disposed to cover or overlap the second substrate 101 and the gate electrodes 130 on the second substrate 101, and the peripheral region insulating layer 290. The cell region insulating layer 190 may be formed of an insulating material or may include a plurality of insulating layers.

Figure 4A:
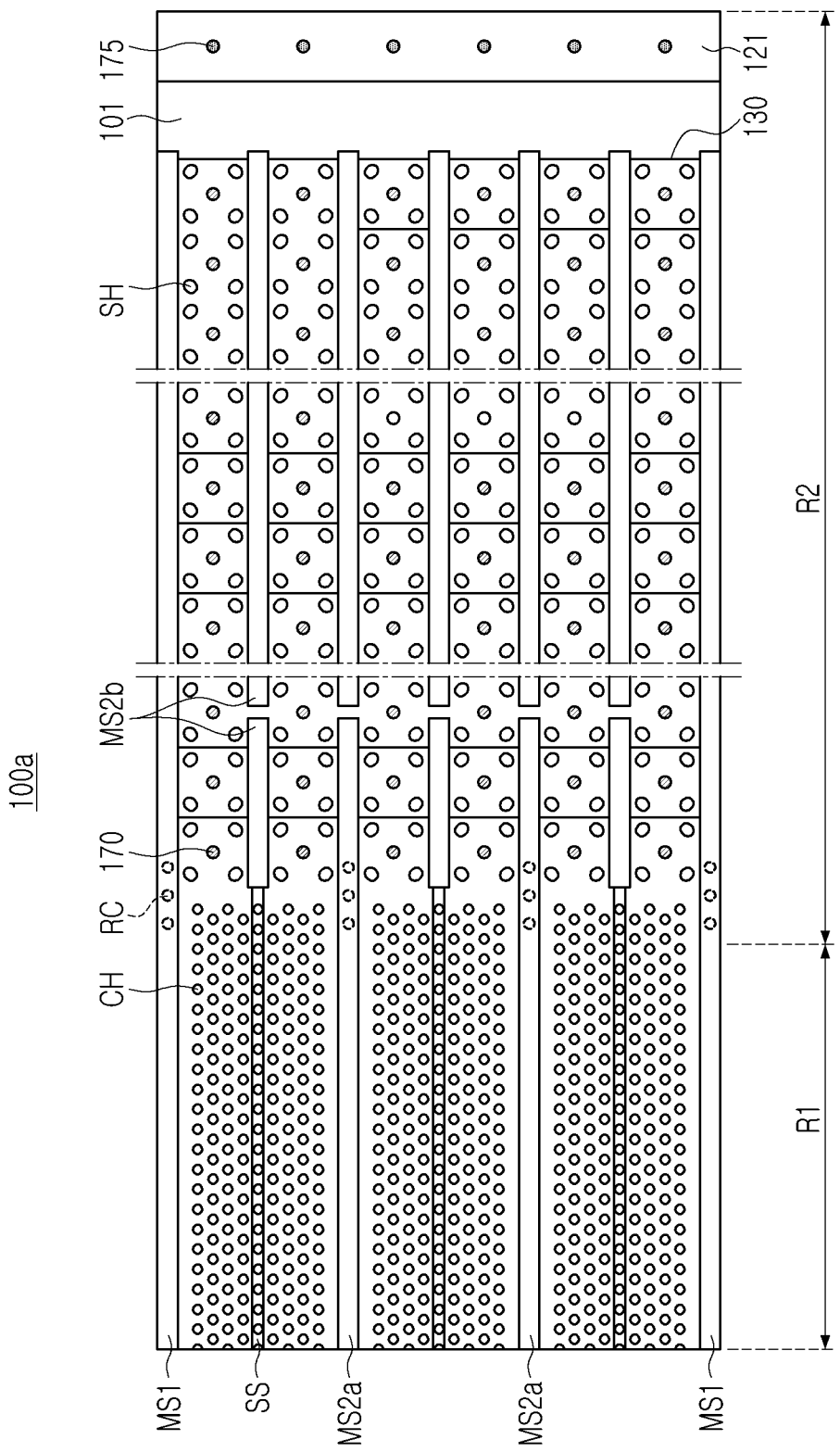
FIGS. 4A to 4C are plan views of semiconductor devices according to example embodiments.
Figure 4B:
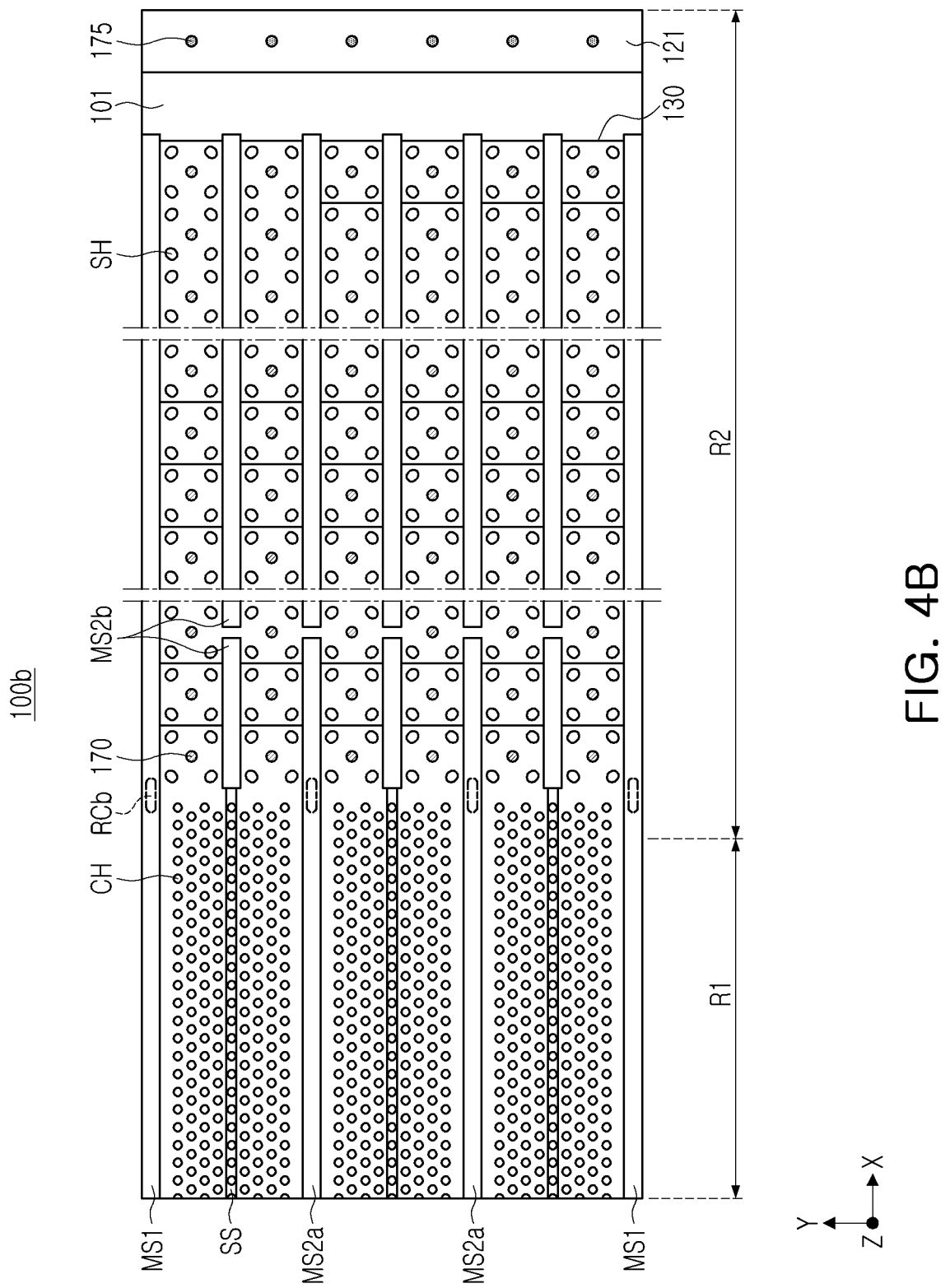
Figure 4C:
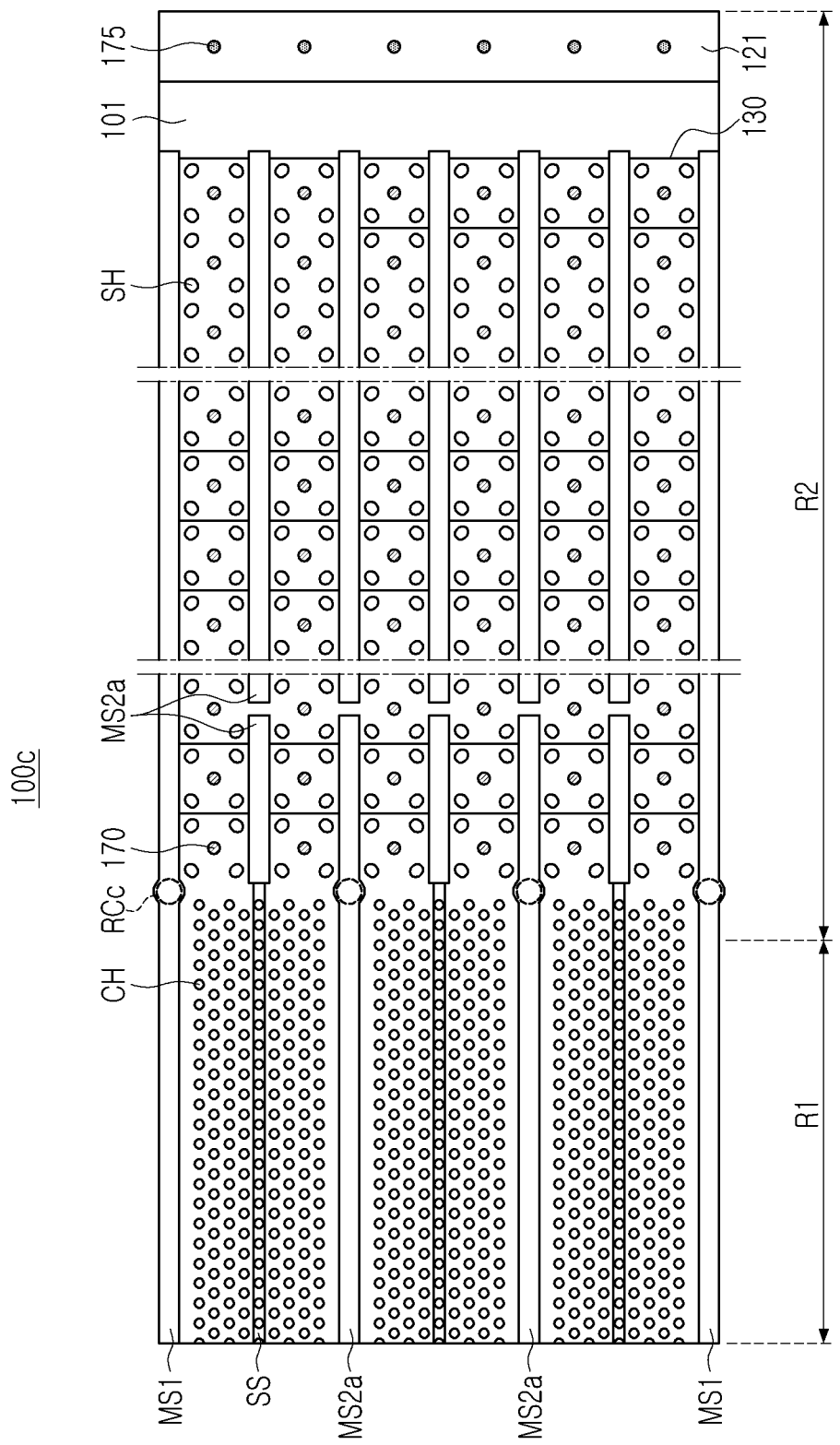

FIGS. 4A to 4C are plan views of semiconductor devices according to example embodiments.

Referring to FIG. 4A, in a semiconductor device 100a, a plurality of recess regions RC may be arranged below each of the first separation regions MS1 and the second central separation regions MS2a. Specifically, two or more, for example, three recess regions RC, may be arranged in the X-direction in a region including a region between the channel structures CH and the support structures SH in the X-direction.

Referring to FIG. 4B, in a semiconductor device 100b, recess regions RCb may have a shape extending in the X-direction. Recess regions RCb may have a shape having a width in the X-direction greater than a width in the Y-direction. The recess regions RCb may have an elongated, elliptical, rectangular shape, or a shape similar thereto, extending in the X-direction within a range overlapping the first separation regions MS1 and the second central separation regions MS2a. As such, in example embodiments, the shape of the recess regions RCb may be variously changed within a range positioned within a boundary of the first separation regions MS1 and a boundary of the second central separation regions MS2a.

Referring to FIG. 4C, in a semiconductor device 100c, recess regions RCc may have an enlarged shape than in the embodiment of FIG. 1. Specifically, a width of the recess regions RCc in the Y-direction may be equal to or greater than a width in a main region in which the first separation regions MS1 and the second central separation regions MS2a extend. In this case, the first separation regions MS1 and the second central separation regions MS2a may also extend outwardly than the recess regions RCc in a region overlapping the recess regions RCc. Accordingly, even in the present example embodiment, the recessed regions RCc may be disposed to entirely overlap the first separation regions MS1 and the second central separation regions MS2a.

Figure 5A:
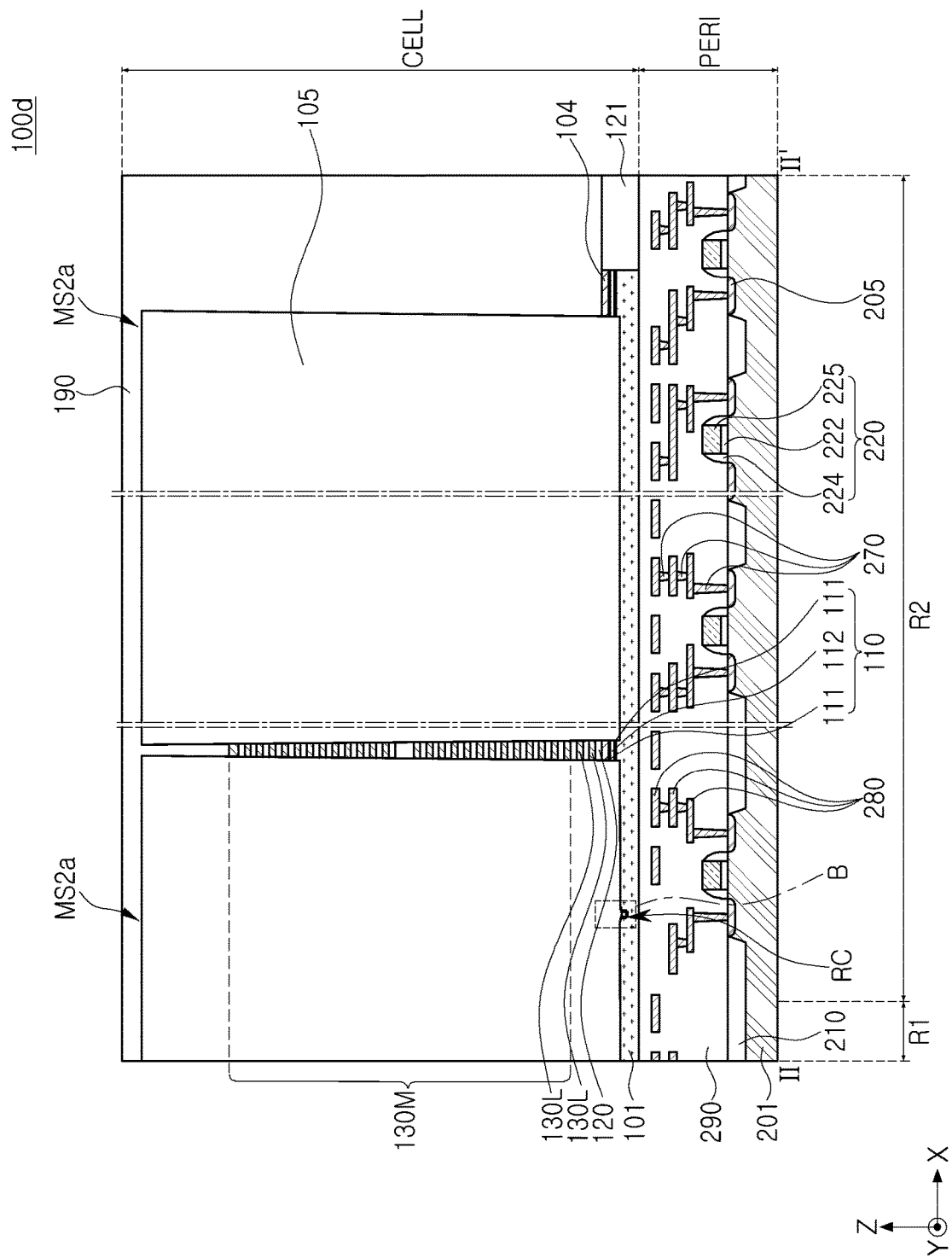
FIGS. 5A and 5B are a schematic cross-sectional view and a partially enlarged view of a semiconductor device according to example embodiments.
Figure 5B:
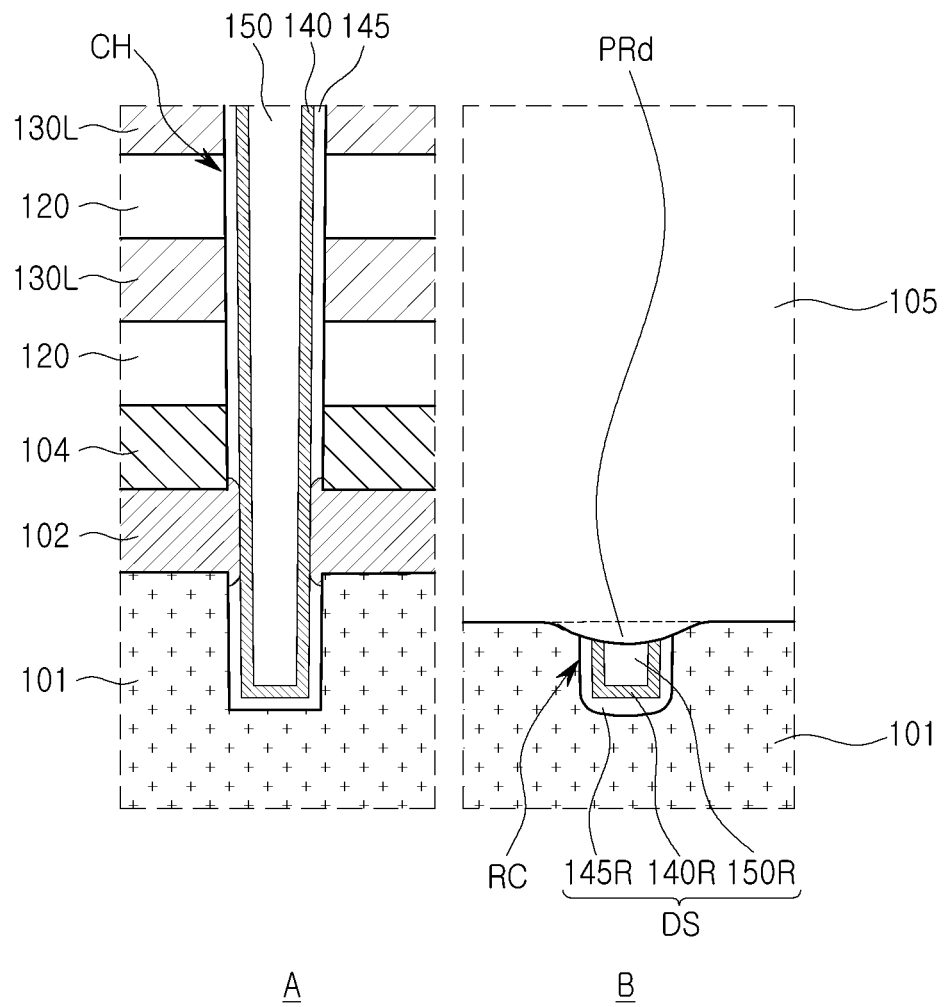

FIGS. 5A and 5B are a schematic cross-sectional view and a partially enlarged view of a semiconductor device according to example embodiments. FIG. 5A illustrates a region corresponding to FIG. 2B, and FIG. 5B illustrates a region corresponding to FIG. 3.

Referring to FIGS. 5A and 5B, the memory cell region CELL of a semiconductor device 100d may further include a dummy structure DS disposed in the recess region RC. The dummy structure DS may include a dummy gate dielectric layer 145R, a dummy channel layer 140R, and a dummy channel filling insulating layer 150R. The dummy structure DS may be formed as a portion of a lower end of the channel structure CH remains, and thus, the dummy structure DS may include layers corresponding to a region including the lower end of the channel structure CH. Specifically, the dummy gate dielectric layer 145R, the dummy channel layer 140R, and the dummy channel filling insulating layer 150R may include the same materials and the same shapes as those of portions including lower ends of the gate dielectric layer 145, the channel layer 140, and the channel filling insulating layer 150 of the channel structure CH, respectively.

The dummy structure DS may have an upper surface positioned on a level lower than a lower surface of the lowermost lower gate electrode 130L. The dummy structure DS may be positioned on a level lower than the upper surface of the second substrate 101 below the isolation insulating layer 105. In some embodiments, a height of the dummy structure DS may be variously changed within the above range. In some embodiments, the isolation insulating layer 105 may have a protrusion PRd protruding downwardly, but is not limited thereto.

Figure 6:
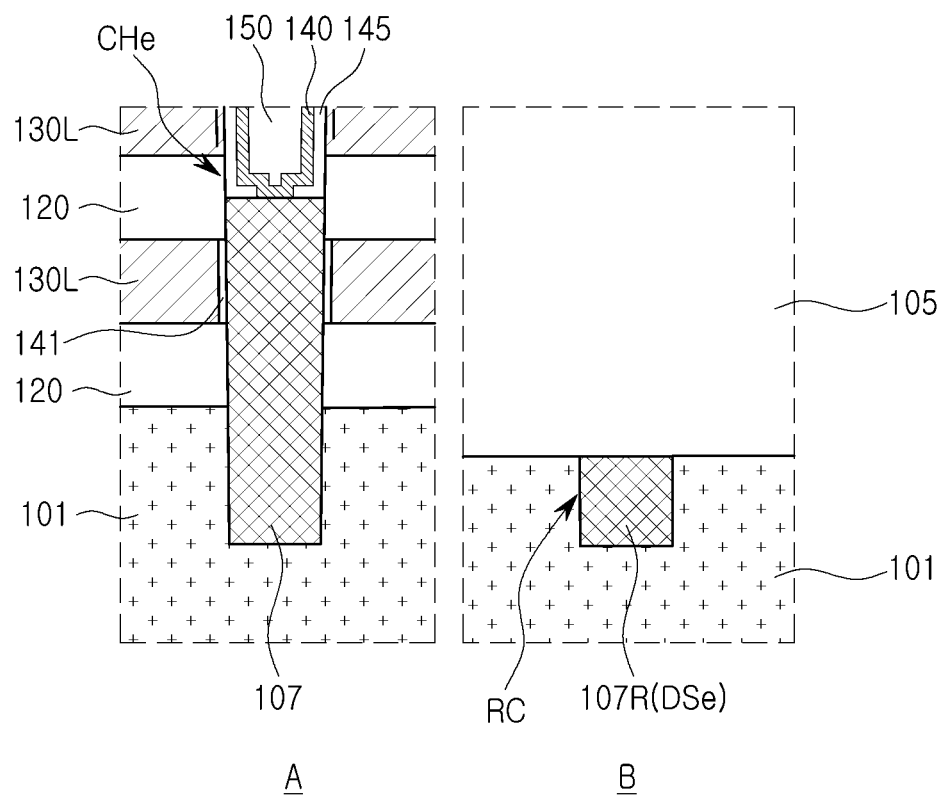
FIG. 6 is a schematic partially enlarged view of a semiconductor device according to example embodiments.

FIG. 6 is a schematic partially enlarged view of a semiconductor device according to example embodiments. FIG. 6 illustrates a region corresponding to FIG. 3.

Figure 2C:
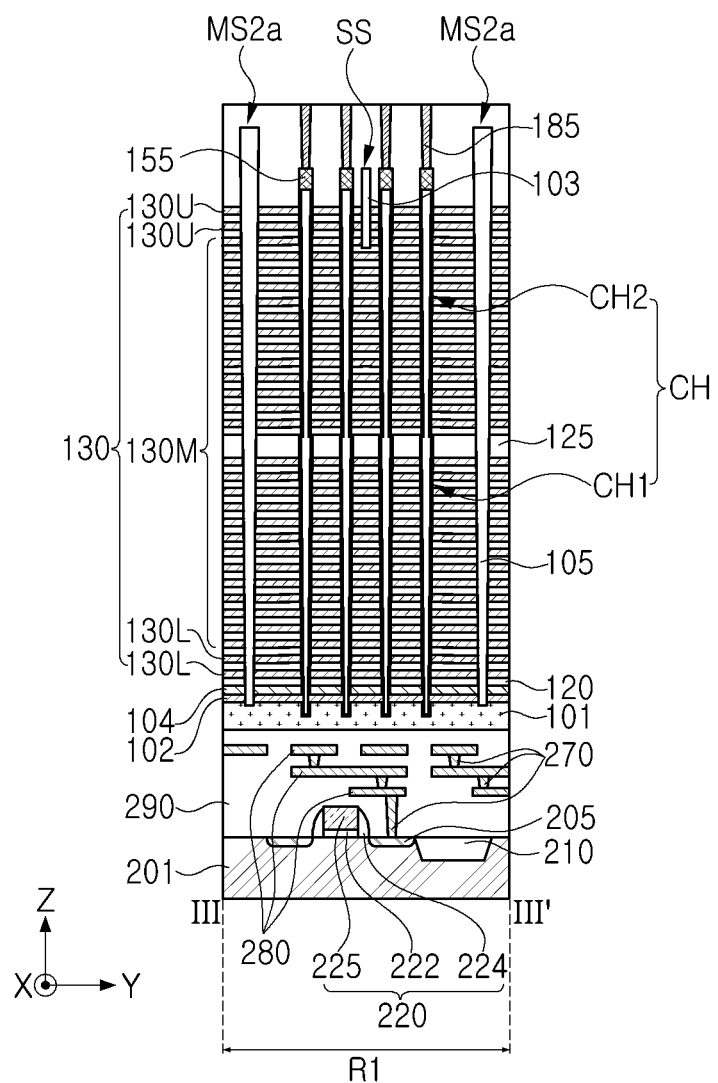
Figure 2D:
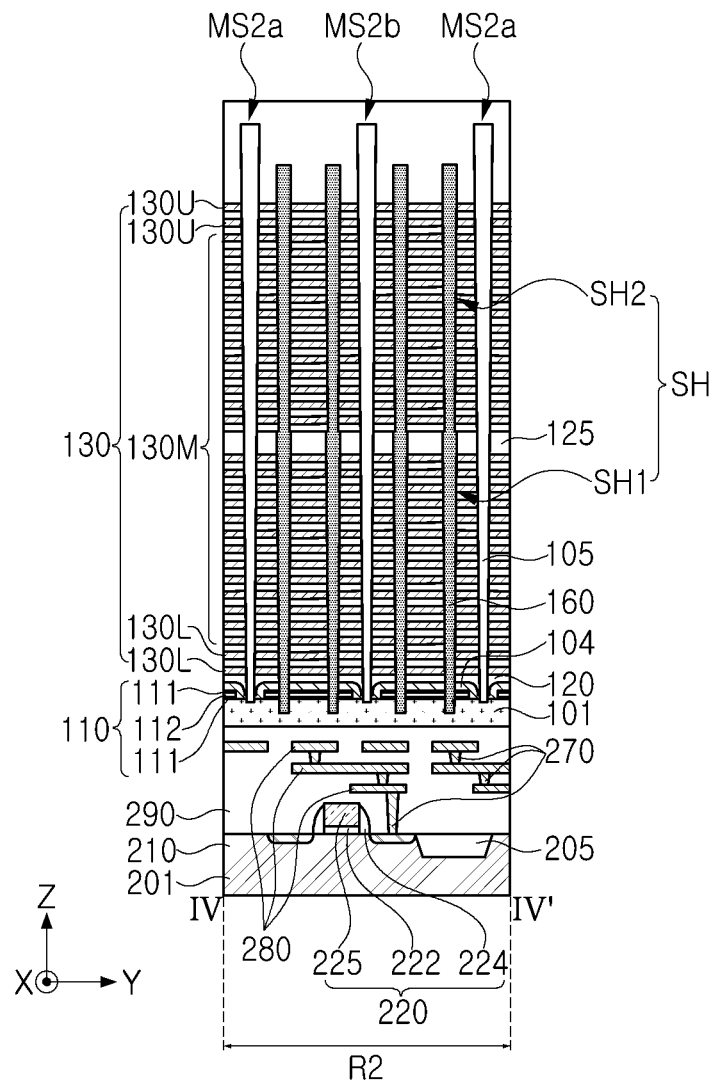

Referring to FIG. 6, in a semiconductor device 100e, the memory cell region CELL may not include the first and second horizontal conductive layers 102 and 104 on the second substrate 101, unlike the embodiments of FIGS. 2A to 3. The memory cell region CELL may further include a dummy structure DSe disposed in the recess region RC, and a channel structure CHe may further include an epitaxial layer 107.

The epitaxial layer 107 may be disposed on the second substrate 101 at a lower end of the channel structure CHe, and may be disposed on a side surface of the at least one lower gate electrode 130L. The epitaxial layer 107 may be disposed in a recessed region of the second substrate 101. A height of a lower surface of the epitaxial layer 107 may be higher than an upper surface of the lowermost lower gate electrode 130L and lower than a lower surface of the lower gate electrode 130L thereabove, but is not limited thereto. The epitaxial layer 107 may be connected to the channel layer 140 through an upper surface. A gate insulating layer 141 may be further disposed between the epitaxial layer 107 and the lower gate electrode 130L in contact with the epitaxial layer 107.

The dummy structure DSe may be disposed in the recess region RC. The dummy structure DSe may include a dummy epitaxial layer 107R. The dummy structure DSe may be formed as a portion of a lower end of the channel structure CHe remains, and thus may include the dummy epitaxial layer 107R corresponding to a region including the lower end of the channel structure CHe. In the present embodiment, the isolation insulating layer 105 may have an approximately flat lower surface in contact with the dummy structure DSe. However, in some embodiments, the lower surface of the isolation insulating layer 105 may have a curve facing upwardly or downwardly in a region in contact with the dummy structure DSe.

Figure 7:
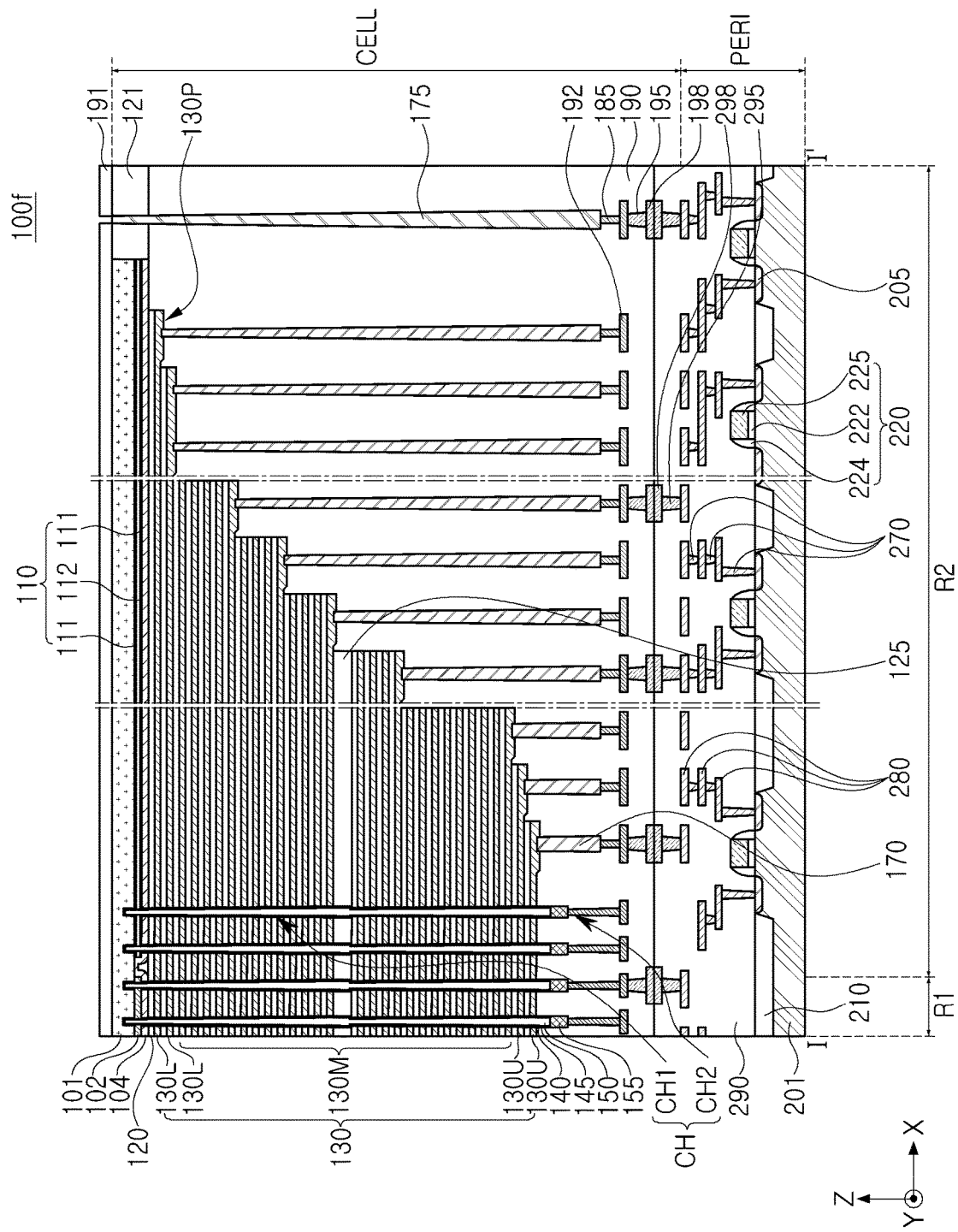
FIG. 7 is a schematic cross-sectional view of a semiconductor device according to example embodiments.

FIG. 7 is a schematic cross-sectional view of a semiconductor device according to example embodiments. FIG. 7 illustrates a cross-section corresponding to FIG. 2A.

Referring to FIG. 7, a semiconductor device 100f may have a structure in which the peripheral circuit region PERI and the memory cell region CELL are vertically bonded through a wafer bonding method. To this end, the peripheral circuit region PERI may further include first bonding vias 295 and first bonding pads 298, and the memory cell region CELL may further include the cell interconnection lines 192, second bonding vias 195, second bonding pads 198, and a passivation layer 191 on the second substrate 101.

The first bonding vias 295 may be disposed on the uppermost circuit interconnection lines 280 to be connected to the circuit interconnection lines 280. At least a portion of the first bonding pads 298 may be connected to the first bonding vias 295 on the first bonding vias 295. The first bonding pads 298 may be connected to the second bonding pads 198 of the memory cell region CELL. The first bonding pads 298, together with the second bonding pads 198, may provide an electrical connection path according to bonding of the peripheral circuit region PERI and the memory cell region CELL. The first bonding vias 295 and the first bonding pads 298 may include a conductive material, for example, copper (Cu).

The cell interconnection lines 192 may be disposed below the upper interconnections 185 and may be connected to the second bonding vias 195. The cell interconnection lines 192 may be formed of a conductive material, and may include, for example, at least one of tungsten (W), aluminum (Al), and/or copper (Cu).

The second bonding vias 195 and the second bonding pads 198 may be disposed below the lowermost cell interconnection lines 192. The second bonding vias 195 may connect the cell interconnection lines 192 and the second bonding pads 198, and the second bonding pads 198 may be bonded to the first bonding pads 298 of the peripheral circuit region PERI. The second bonding vias 195 and the second bonding pads 198 may include a conductive material, for example, copper (Cu).

The passivation layer 191 may be disposed on the second substrate 101 to protect the second substrate 101 and may include an insulating material. Upper surfaces of the through-vias 175 may be exposed through the passivation layer 191 to be used as I/O pads. However, the structure of the upper ends of the through-vias 175 may not be necessarily exposed, and may be variously changed in embodiments.

The peripheral circuit region PERI and the memory cell region CELL may each form a semiconductor structure, and may be bonded by copper (Cu)-to-copper (Cu) bonding by the first bonding pads 298 and the second bonding pads 198. In addition to the copper (Cu)-to-copper (Cu) bonding, the peripheral circuit region PERI and the memory cell region CELL may be additionally bonded by dielectric-to-dielectric bonding. The dielectric-to-dielectric bonding may be bonding by dielectric layers forming a portion of each of the peripheral region insulating layer 290 and the cell region insulating layer 190 and surrounding each of the first bonding pads 298 and the second bonding pads 198. Accordingly, the peripheral circuit region PERI and the memory cell region CELL may be bonded without a separate adhesive layer.

FIGS. 8A to 14B are schematic cross-sectional views illustrating a method of manufacturing a semiconductor device according to example embodiments. FIGS. 8A, 9A, 10A, 11A, 13A, and 14A illustrate a cross-section corresponding to FIG. 2A, and FIGS. 8B, 9B, 10B, 11B, 12, 13B, and 14B illustrate a cross-section corresponding to FIG. 2B.

Figure 8A:
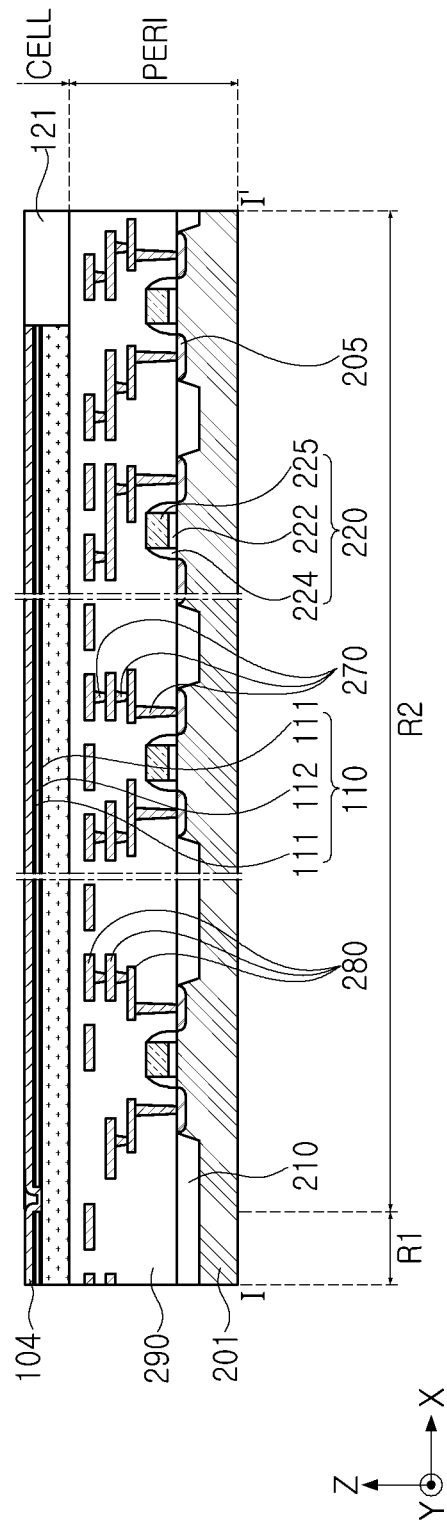
FIGS. 8A, 8B, 9A, 9B, 10A, 10B, 11A, 11B, 12, 13A, 13B, 14A, and 14B are schematic cross-sectional views illustrating a method of manufacturing a semiconductor device according to example embodiments.
Figure 8B:
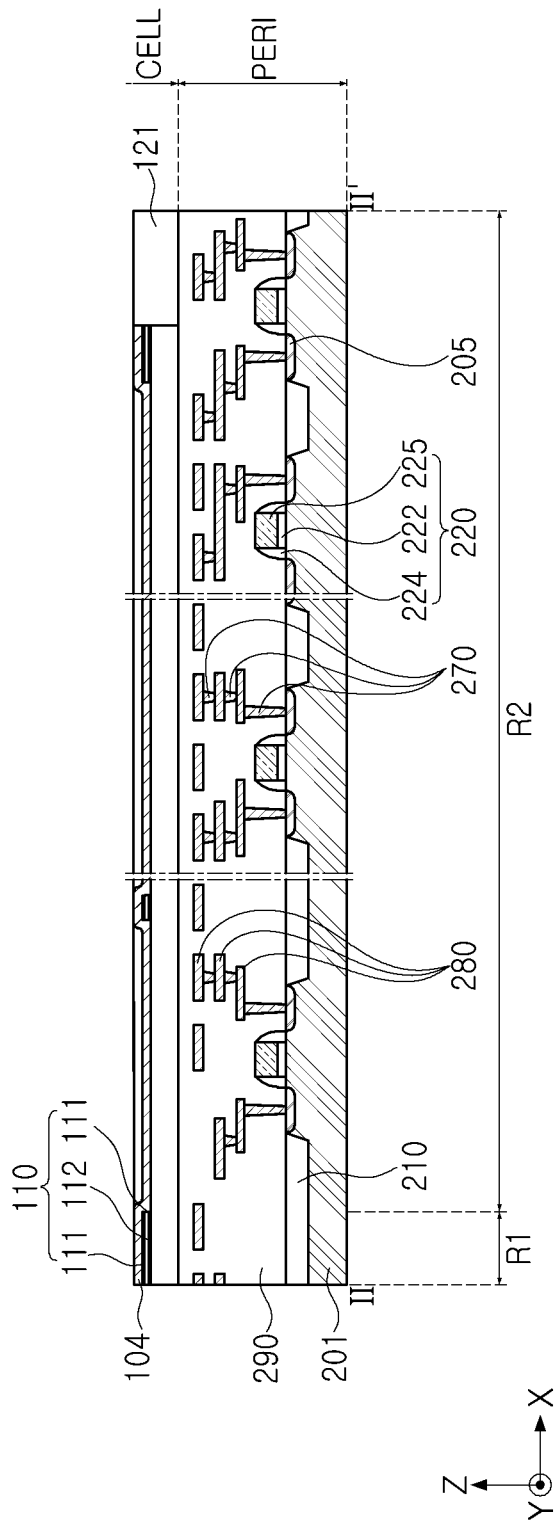

Referring to FIGS. 8A and 8B, a peripheral circuit region PERI including circuit elements 220 and circuit wiring structures may be formed on a first substrate 201, and may form a second substrate 101, a horizontal insulating layer 110, a second horizontal conductive layer 104, and a substrate insulating layer 121 in which a memory cell region CELL is provide, on the peripheral circuit region PERI.

First, device isolation layers 210 may be formed in a first substrate 201, and a circuit gate dielectric layer 222 and a circuit gate electrode 225 may be sequentially formed on the first substrate 201. The device isolation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer, but is not limited thereto. Thereafter, a spacer layer 224 and source/drain regions 205 may be formed on both sidewalls of the circuit gate dielectric layer 222 and the circuit gate electrode 225. In some embodiments, the spacer layer 224 may include a plurality of layers. Thereafter, an ion implantation process may be performed to form the source/drain regions 205.

The circuit contact plugs 270 of the circuit wiring structure may be formed by partially forming the peripheral region insulating layer 290, removing a portion of the insulating layer 290 by etching, and then filling the portion with a conductive material. The circuit interconnection lines 280 may be formed by, for example, depositing a conductive material and then patterning the conductive material.

The peripheral region insulating layer 290 may include a plurality of insulating layers. A portion of the peripheral region insulating layer 290 may be formed in each step of forming the circuit wiring structures and a portion thereof may be formed above the uppermost circuit interconnection line 280, thereby forming the peripheral region insulating layer 290 to finally cover the circuit elements 220 and the circuit wiring structures.

Next, the second substrate 101 may be formed on the peripheral region insulating layer 290. The second substrate 101 may be formed of, for example, polycrystalline silicon, and may be formed by a CVD process. Polycrystalline silicon constituting the second substrate 101 may include impurities.

The first and second horizontal insulating layers 111 and 112 that make up the horizontal insulating layer 110 may be alternately stacked on the second substrate 101. The horizontal insulating layer 110 may be partially replaced with the first horizontal conductive layer 102 of FIG. 2A through a subsequent process. The first horizontal insulating layers 111 may include a material different from that of the second horizontal insulating layer 112. For example, the first horizontal insulating layers 111 may be formed of the same material as that of the interlayer insulating layers 120, and the second horizontal insulating layer 112 may be formed of the same material as that of the subsequent sacrificial insulating layers 118. The horizontal insulating layer 110 may be partially removed by a patterning process in some regions, for example, in the second region R2 of the second substrate 101.

The second horizontal conductive layer 104 may be formed on the horizontal insulating layer 110 and may be in contact with the second substrate 101 in a region from which the horizontal insulating layer 110 is removed. Accordingly, the second horizontal conductive layer 104 may be bent along end portions of the horizontal insulating layer 110, cover the ends, and extend onto the second substrate 101.

The substrate insulating layer 121 may be formed to penetrate through the second substrate 101 in a partial region including a region in which the through via 175 (refer to FIG. 1) is to be disposed. The substrate insulating layer 121 may be formed by removing portions of the second substrate 101, the horizontal insulating layer 110, and the second horizontal conductive layer 104, and then filling the removed portions with the insulating material. After filling of the insulating material, a planarization process may be further performed using a chemical mechanical polishing (CMP) process. Accordingly, an upper surface of the substrate insulating layer 121 may be substantially coplanar with the uppermost surface of the second horizontal conductive layer 104.

Figure 9A:
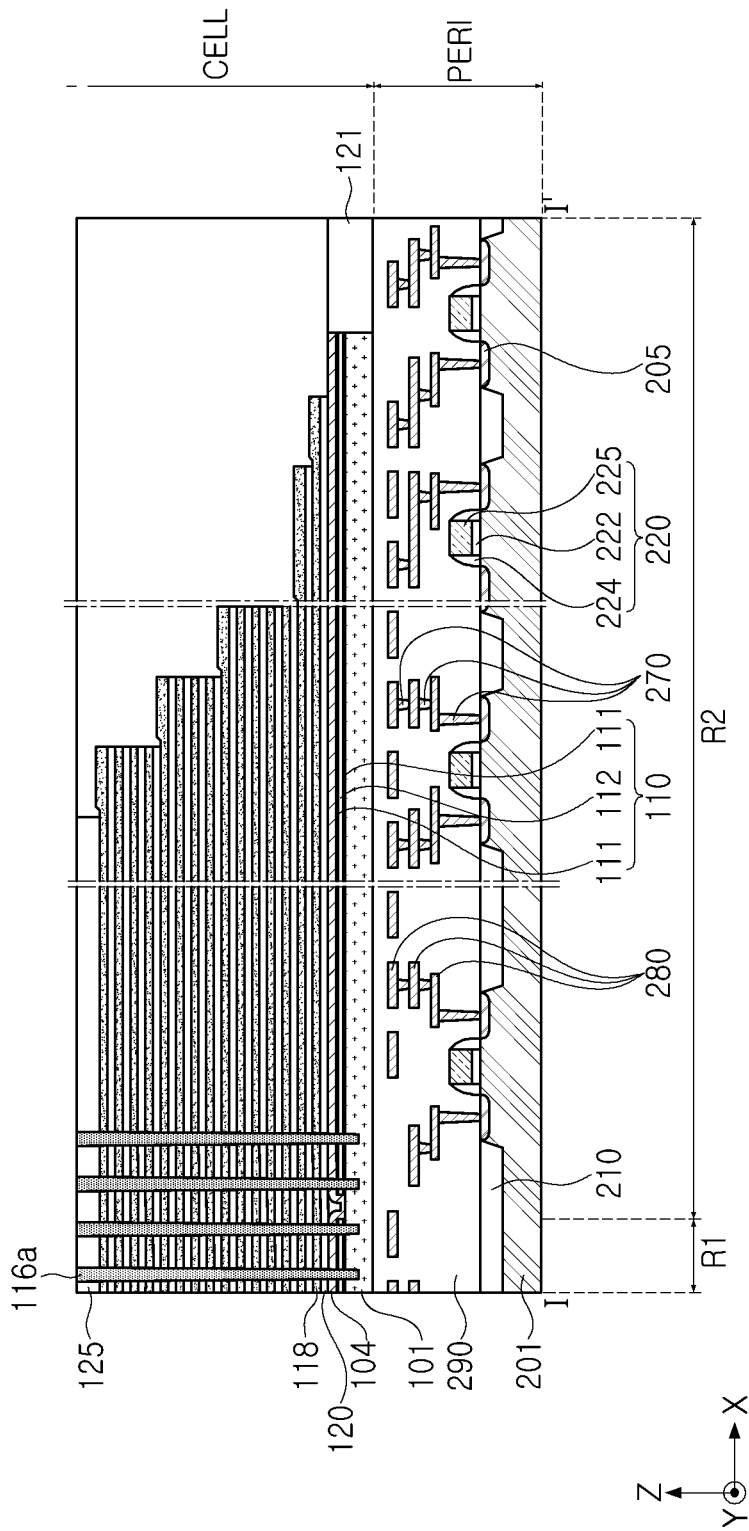
Figure 9B:
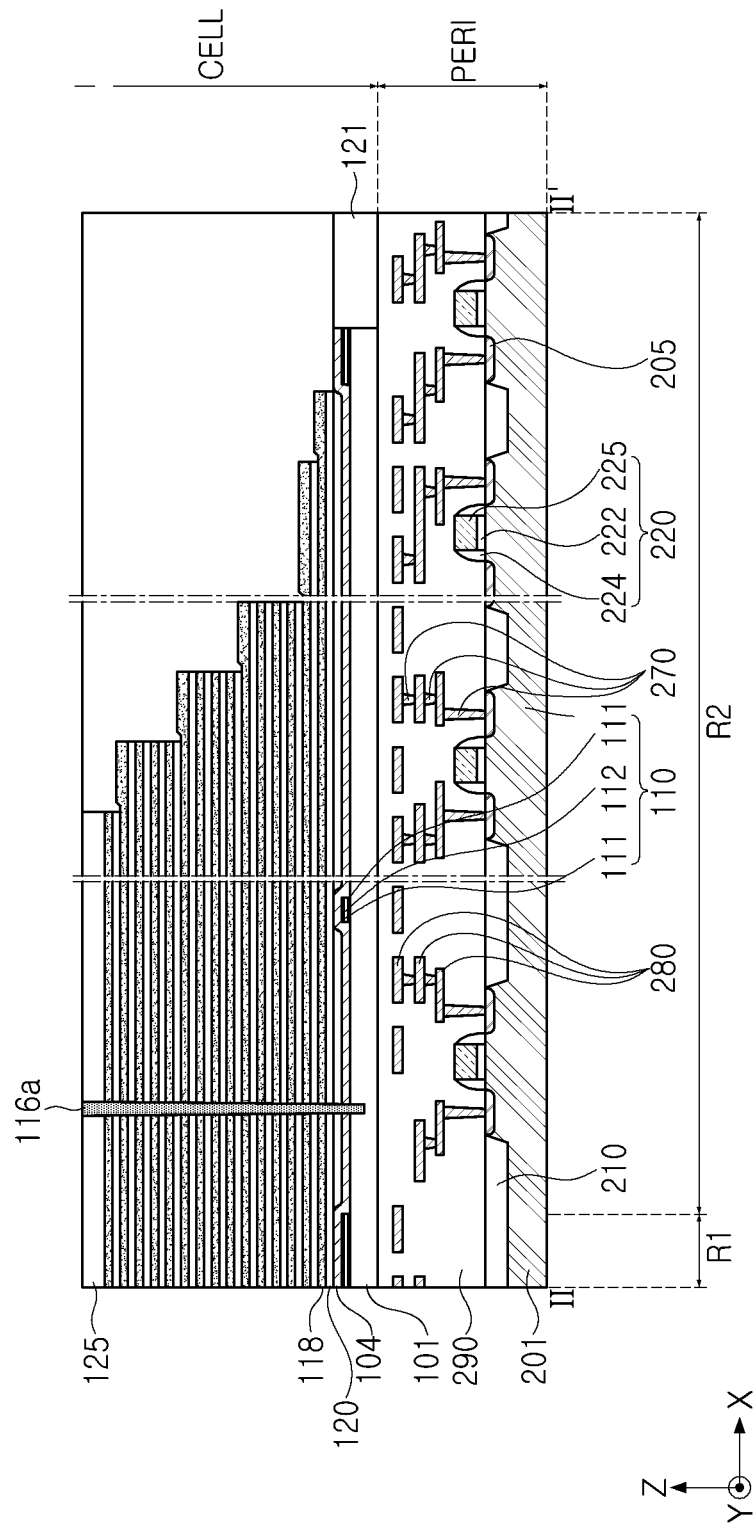

Referring to FIGS. 9A and 9B, interlayer insulating layers 120 and sacrificial insulating layers 118 forming a lower stack structure may be alternately stacked on the second horizontal conductive layer 104, a step structure may be formed, and thereafter, vertical sacrificial layers 116a penetrating through the lower stack structure may be formed.

In this stage, sacrificial insulating layers 118 and interlayer insulating layers 120 may be formed in a region in which the first channel structures CH1 (refer to FIG. 2A) is disposed. A relatively thick upper interlayer insulating layer 125 may be formed on the uppermost portion. The sacrificial insulating layers 118 may be replaced by the gate electrodes 130 (refer to FIG. 2A) through a subsequent process.

The sacrificial insulating layers 118 may be formed of a material different from that of the interlayer insulating layers 120. For example, the interlayer insulating layer 120 and the upper interlayer insulating layer 125 may be formed of at least one of silicon oxide and/or silicon nitride, and the sacrificial insulating layers 118 may be formed of a material different from that of the interlayer insulating layer 120 selected from among silicon, silicon oxide, silicon carbide, and/or silicon nitride. In some embodiments, the thicknesses of the interlayer insulating layers 120 may not all be the same. In addition, the thicknesses of the interlayer insulating layers 120 and the sacrificial insulating layers 118 and the number of films that make up the interlayer insulating layers 120 and the sacrificial insulating layers 118 may be variously changed from those illustrated.

Next, photolithography and etching processes may be repeatedly performed on the sacrificial insulating layers 118 using a mask layer so that the upper sacrificial insulating layers 118 may extend shorter than the lower sacrificial insulating layers 118 in the second region R2. Accordingly, the sacrificial insulating layers 118 may form a step structure having a shape of stairs in a predetermined unit. Thereafter, the sacrificial insulating layers 118 may be further formed on the step structure to make the sacrificial insulating layer positioned at the uppermost portion in each region formed to be thicker.

Thereafter, a portion of the cell region insulating layer 190 covering or overlapping the lower stack structure of the sacrificial insulating layers 118 and the interlayer insulating layers 120 may be formed.

Next, the first vertical sacrificial layers 116a may be formed in a region corresponding to the first channel structures CH1 (refer to FIG. 2A). Also, as shown in FIG. 9B, the first vertical sacrificial layer 116a may be further formed in a region corresponding to the recess region RC (refer to FIGS. 1 and 2B) and a region corresponding to the support structures SH (refer to FIGS. 1 and 2D). The first vertical sacrificial layers 116a may be formed by forming lower holes penetrating through the lower stack structure and then depositing a material forming the first vertical sacrificial layers 116a in the lower holes. The first vertical sacrificial layers 116a may include, for example, polycrystalline silicon.

Figure 10A:
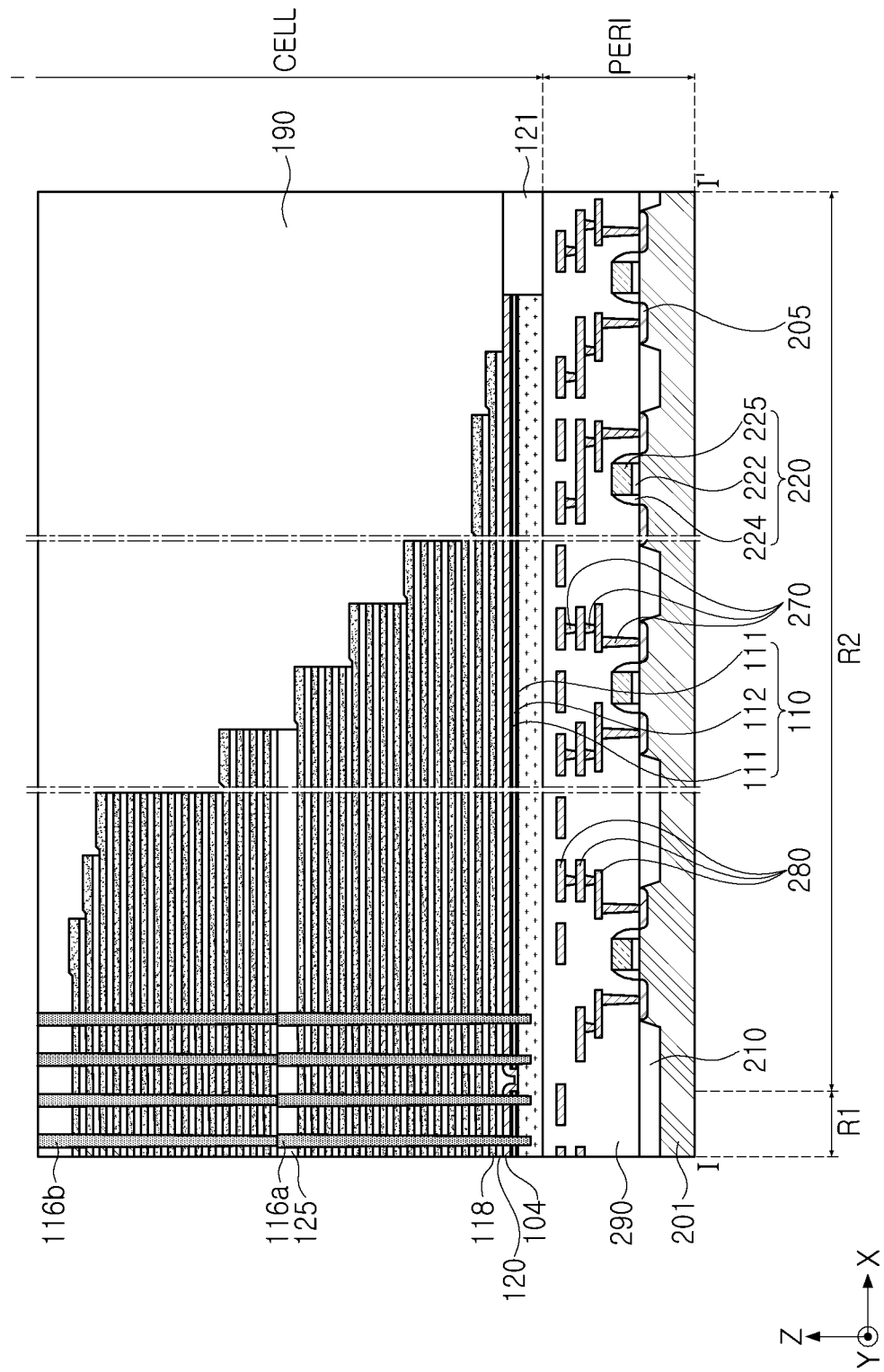
Figure 10B:
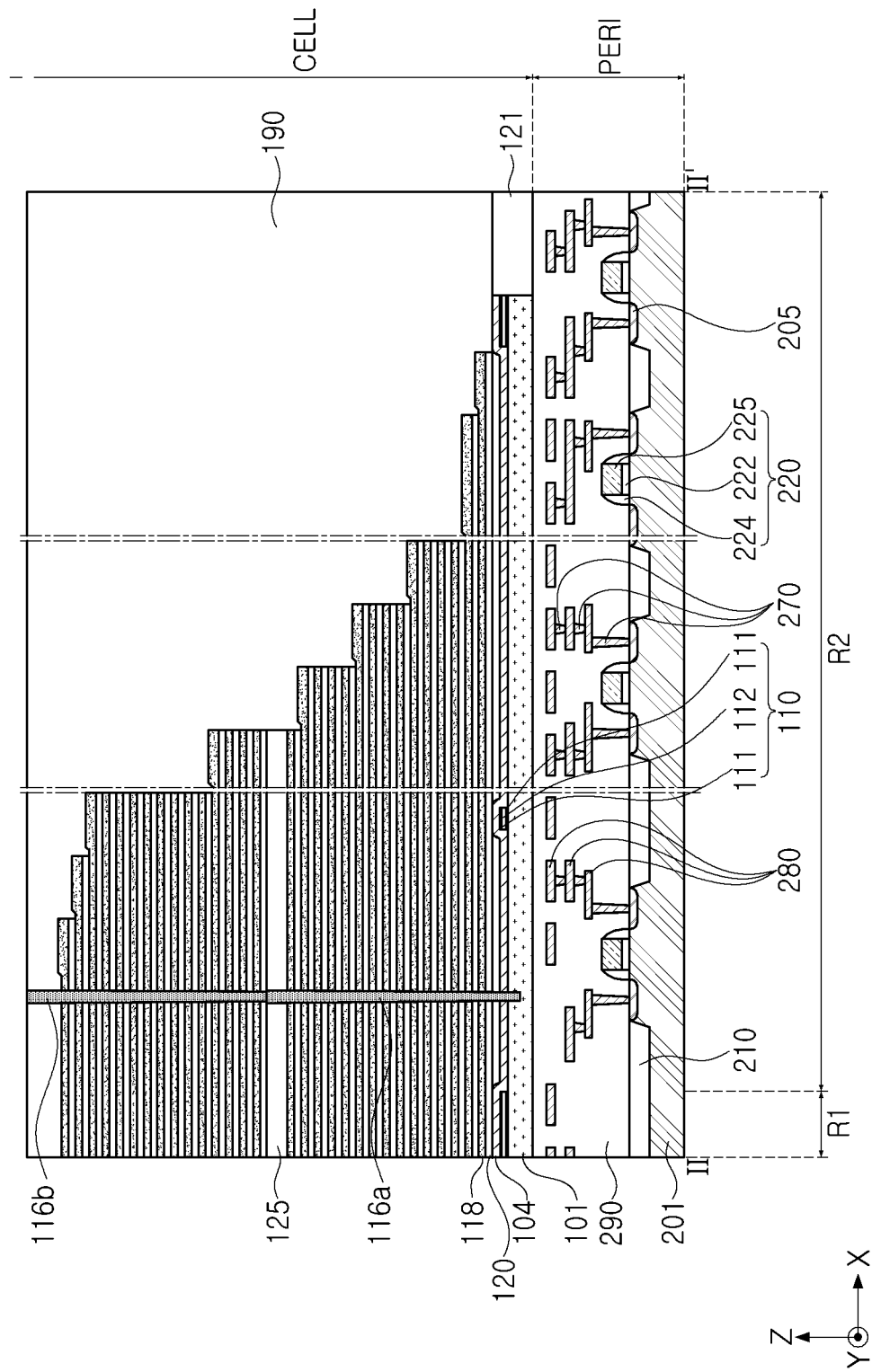

Referring to FIGS. 10A and 10B, an upper stack structure may be formed, and second vertical sacrificial layers 116b penetrating through the upper stack structure may be formed.

After alternately stacking sacrificial insulating layers 118 and interlayer insulating layers 120 constituting the upper stack structure on the lower stack structure, a step structure may be formed. In this stage, a process for the lower stack structure described above with reference to FIGS. 9A and 9B may be performed in the same manner in the upper region in which the second channel structures CH2 (refer to FIG. 2A) are disposed.

Next, a portion of the cell region insulating layer 190 covering or overlapping the upper stack structure of the sacrificial insulating layers 118 and the interlayer insulating layers 120 may be further formed, and second vertical sacrificial layers 116b may be formed. The second vertical sacrificial layers 116b may be formed by forming upper holes so that the upper ends of the first vertical sacrificial layers 116a are exposed through the upper stack structure, and then depositing a material forming the second vertical sacrificial layers in the upper holes. The second vertical sacrificial layers 116b may include, for example, polycrystalline silicon.

Figure 11A:
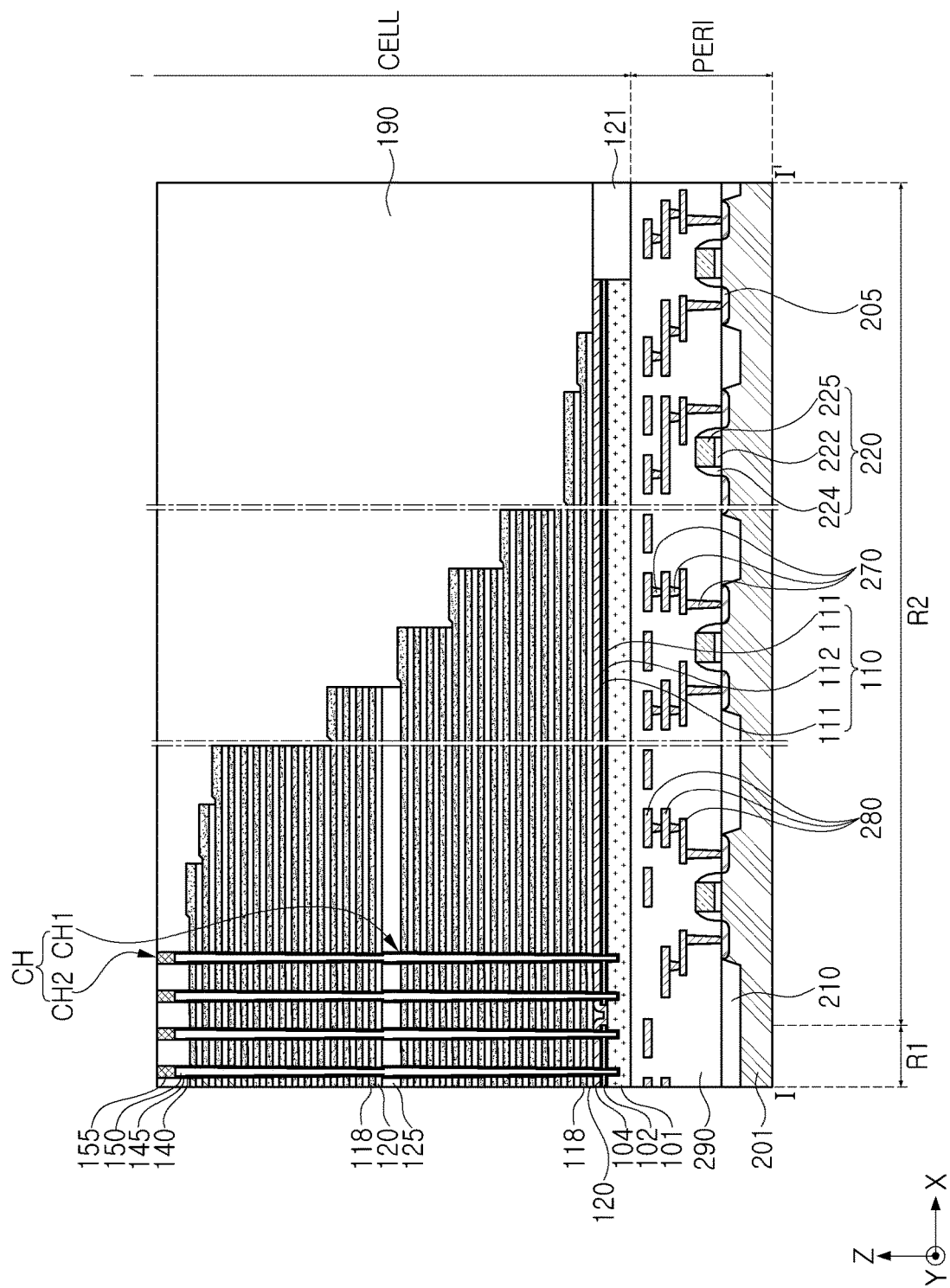
Figure 11B:
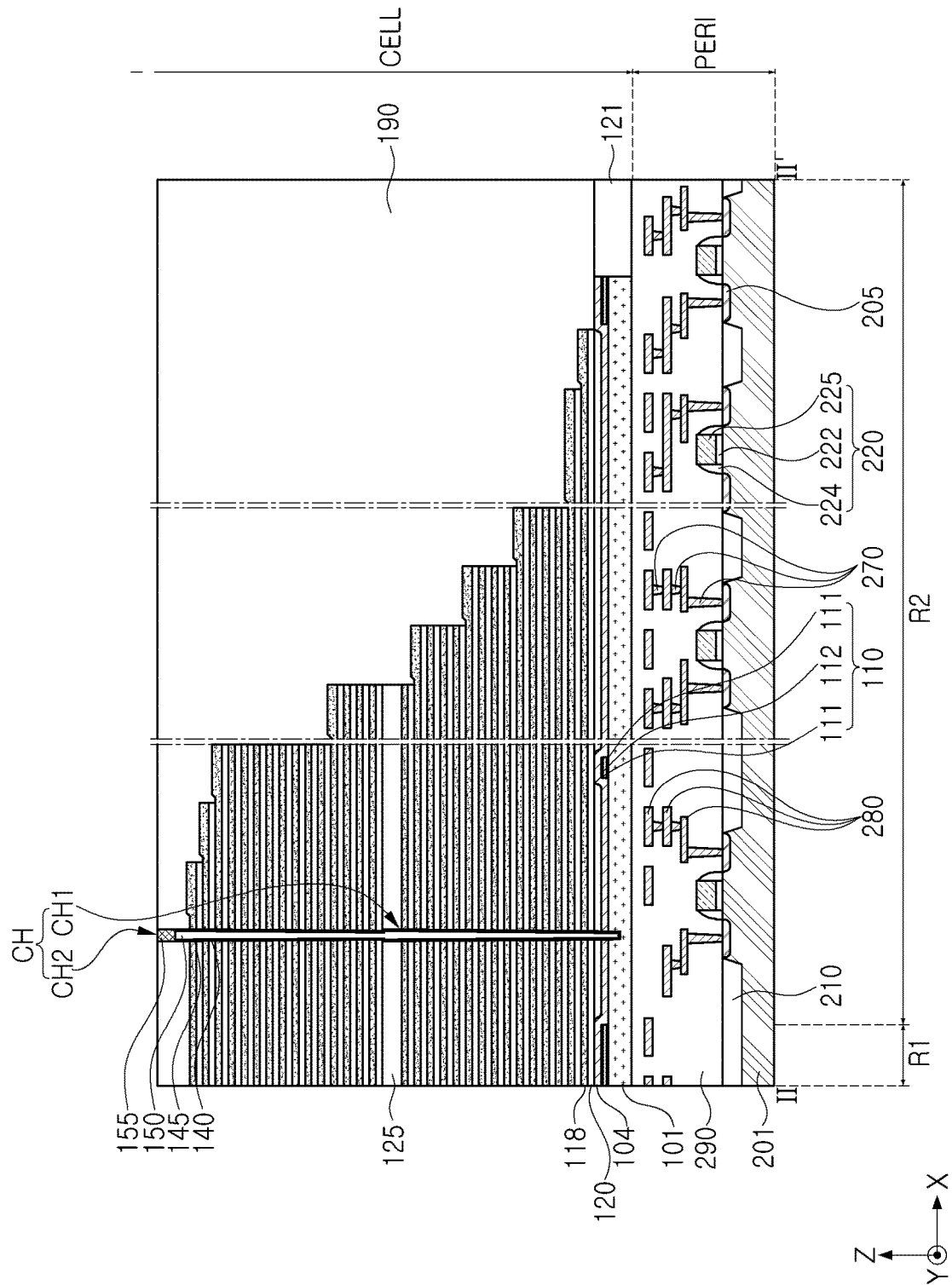

Referring to FIGS. 11A and 11B, the first and second vertical sacrificial layers 116a and 116b may be removed to form channel structures CH.

First, portions of the sacrificial insulating layers 118 and the interlayer insulating layers 120 may be removed to form an upper separation region SS (refer to FIG. 2C). In order to form the upper separation region SS, a region in which the upper separation region SS is to be formed may be exposed using a separate mask layer, a predetermined number of sacrificial insulating layers 118 and interlayer insulating layers 120 may be removed from the uppermost portion, and thereafter, an insulating material may be deposited, thereby forming the upper isolation insulating layer 103 (refer to FIG. 2C).

Next, the channel structures CH may be formed by forming channel holes by removing the first and second vertical sacrificial layers 116a and 116b, and then filling the channel holes. Specifically, the channel structures CH may be formed by sequentially forming the gate dielectric layer 145, the channel layer 140, the channel filling insulating layer 150, and the channel pads 155 in the channel holes. The channel layer 140 may be formed on the gate dielectric layer 145 in the channel structures CH. The channel filling insulating layer 150 may be formed to fill the channel structures CH, and may be an insulating material. However, according to some embodiments, a space between the channel layers 140 may be filled with a conductive material instead of the channel filling insulating layer 150. The channel pads 155 may be formed of a conductive material, for example, polycrystalline silicon. In this stage, the channel structure CH formed in the region shown in FIG. 11B may be removed in a subsequent process and may correspond to a dummy channel structure.

After forming the channel structures CH, the support structures SH (refer to FIGS. 1 and 2D) may be formed in a similar manner. Specifically, the support structures SH may be formed by removing the first and second vertical sacrificial layers 116a and 116b to form support holes, and then filling the support holes with an insulating material.

Figure 12:
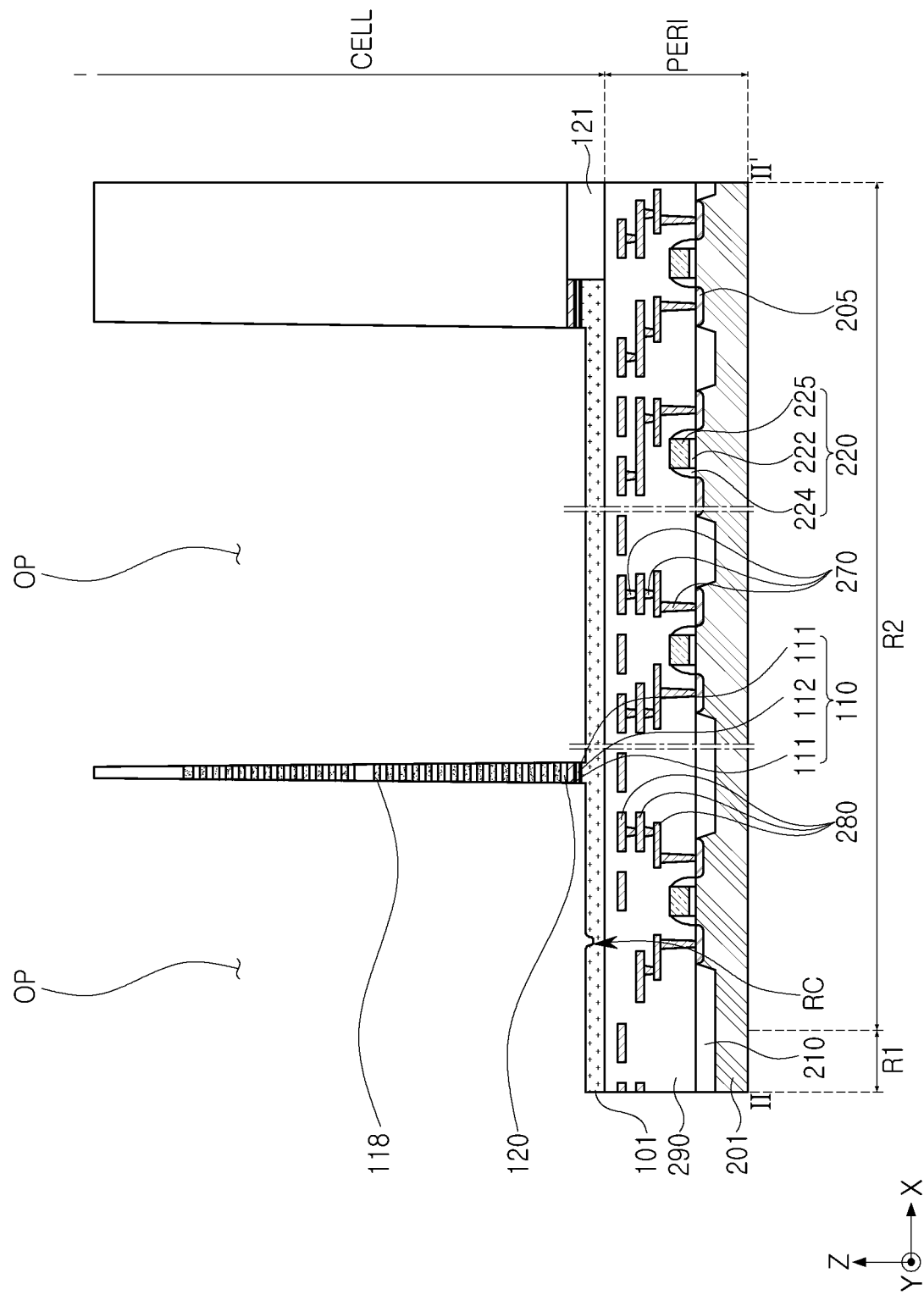
Figure 13A:
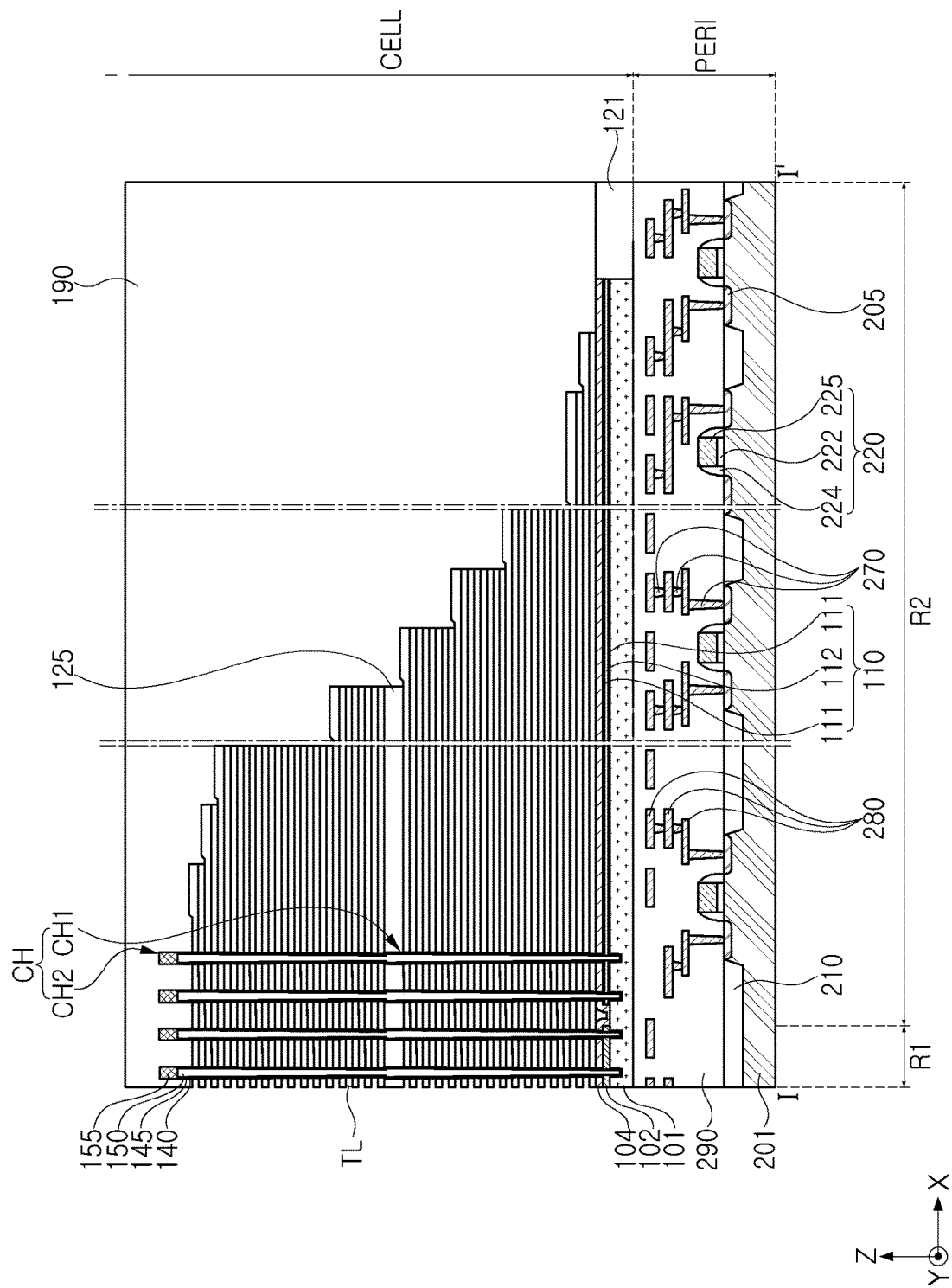
Figure 13B:
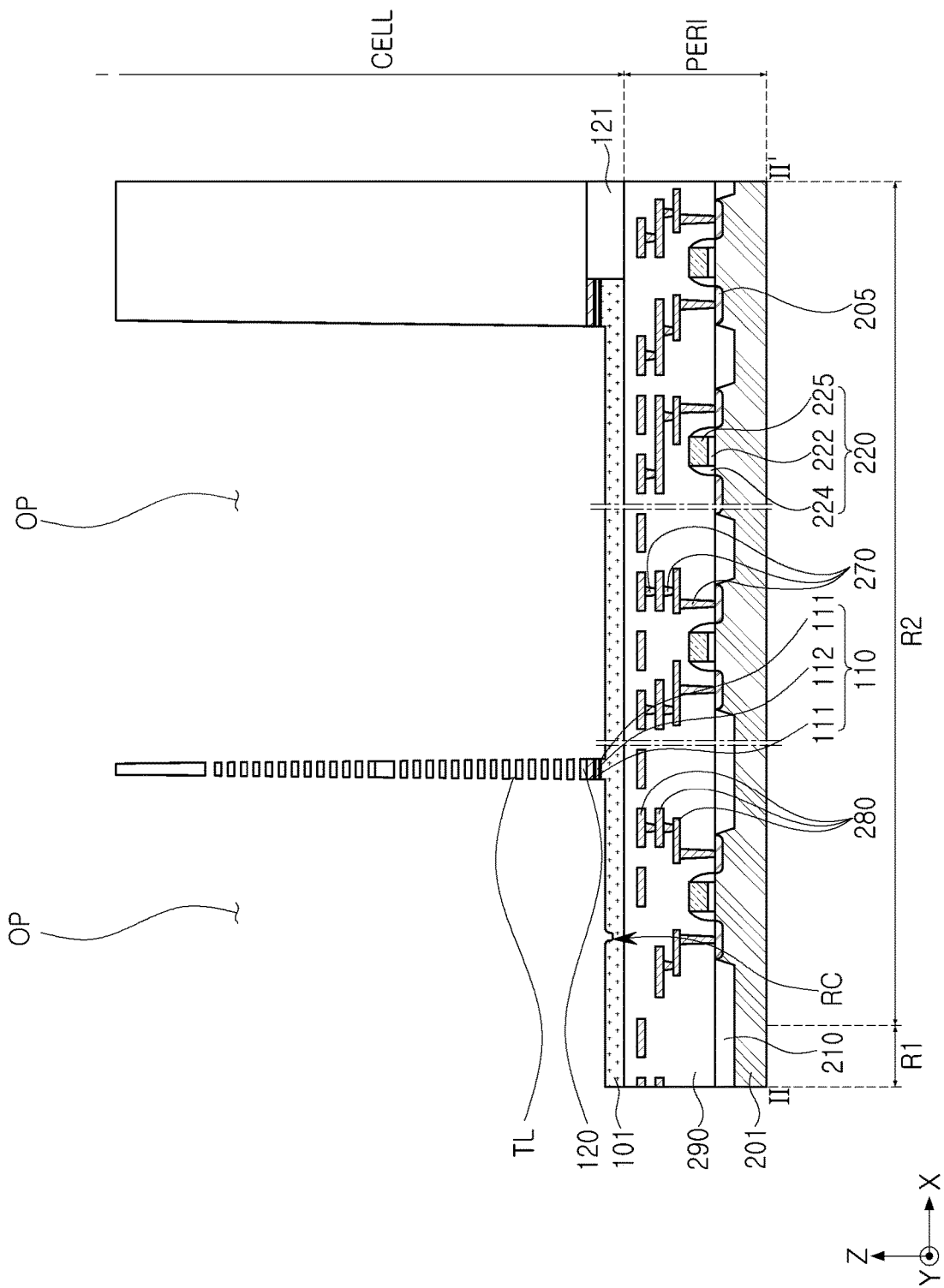

Referring to FIG. 12, openings OP extending to the second substrate 101 through the sacrificial insulating layers 118 and the interlayer insulating layers 120 may be formed.

First, the cell region insulating layer 190 may be further formed, and the openings OP may be formed in positions corresponding to the first and second separation regions MS1, MS2a, and MS2b (refer to FIG. 1). In this stage, as shown in FIG. 11B, in a state in which the channel structure CH is further formed in the region corresponding to the first separation regions MS1 and the second central separation regions MS2a of FIG. 1, the openings OP may be formed. Accordingly, a phenomenon in which an electric field generated when the openings OP are formed is concentrated on the channel structures CH may be prevented. The electric field concentration phenomenon occurs due to a structural difference in which the channel structures CH include the conductive layer and the support structures SH do not include a conductive layer. However, in some embodiments, the electric field may be distributed by the channel structure CH further formed in regions corresponding to the first separation regions MS1 and the second central separation regions MS2a, so that a side surface of the openings may not be deformed such as protruding in the Y-direction, and may be formed vertically.

When the openings OP are formed, the channel structures CH disposed to overlap the first separation regions MS1 and the second central separation regions MS2a may be removed together with the sacrificial insulating layers 118 and the interlayer insulating layer 120. Accordingly, as shown in FIG. 12, the recess region RC may be formed on a bottom surface of the opening OP. When the opening OP is formed, the channel structures CH may be relatively preferentially removed due to a material difference between the channel structures CH and the second substrate 101. Accordingly, the recess region RC may be formed such that the bottom surface of the opening OP protrudes downwardly. However, according to some embodiments, a depth and shape of the recess region RC may be variously changed.

Referring to 13A and 13B, the first horizontal conductive layer 102 may be formed, and the sacrificial insulating layers 118 may be removed.

First, the second horizontal insulating layer 112 may be exposed in the first region R1 by performing an etch-back process, while separate sacrificial spacer layers are formed in the openings OP. The second horizontal insulating layer 112 may be selectively removed from the exposed region, and then the upper and lower first horizontal insulating layers 111 may be removed. The first and second horizontal insulating layers 111 and 112 may be removed by, for example, a wet etching process. Accordingly, the openings OP may additionally extend from the first region R1 to the second substrate 101. In the process of removing the first and second horizontal insulating layers 111 and 112, a portion of the gate dielectric layer 145 exposed in the region from which the second horizontal insulating layer 112 is removed may also be removed. In this stage, in the second region R2, the openings OP may be formed to be spaced apart from the horizontal insulating layer 110, so that the horizontal insulating layer 110 may not be exposed through the openings OP. Accordingly, the horizontal insulating layer 110 may remain in the second region R2.

In the first region R1, a conductive material may be deposited in the region from which the first and second horizontal insulating layers 111 and 112 are removed, to form the first horizontal conductive layer 102, and thereafter, the sacrificial spacer layers may be removed from within the openings OP. Through this process, the first horizontal conductive layer 102 may be formed in the first region R1.

Next, the sacrificial insulating layers 118 may be selectively removed with respect to the interlayer insulating layers 120, the second horizontal conductive layer 104, and the substrate insulating layer 121 using, for example, wet etching, to form tunnel portions TL.

Figure 14A:
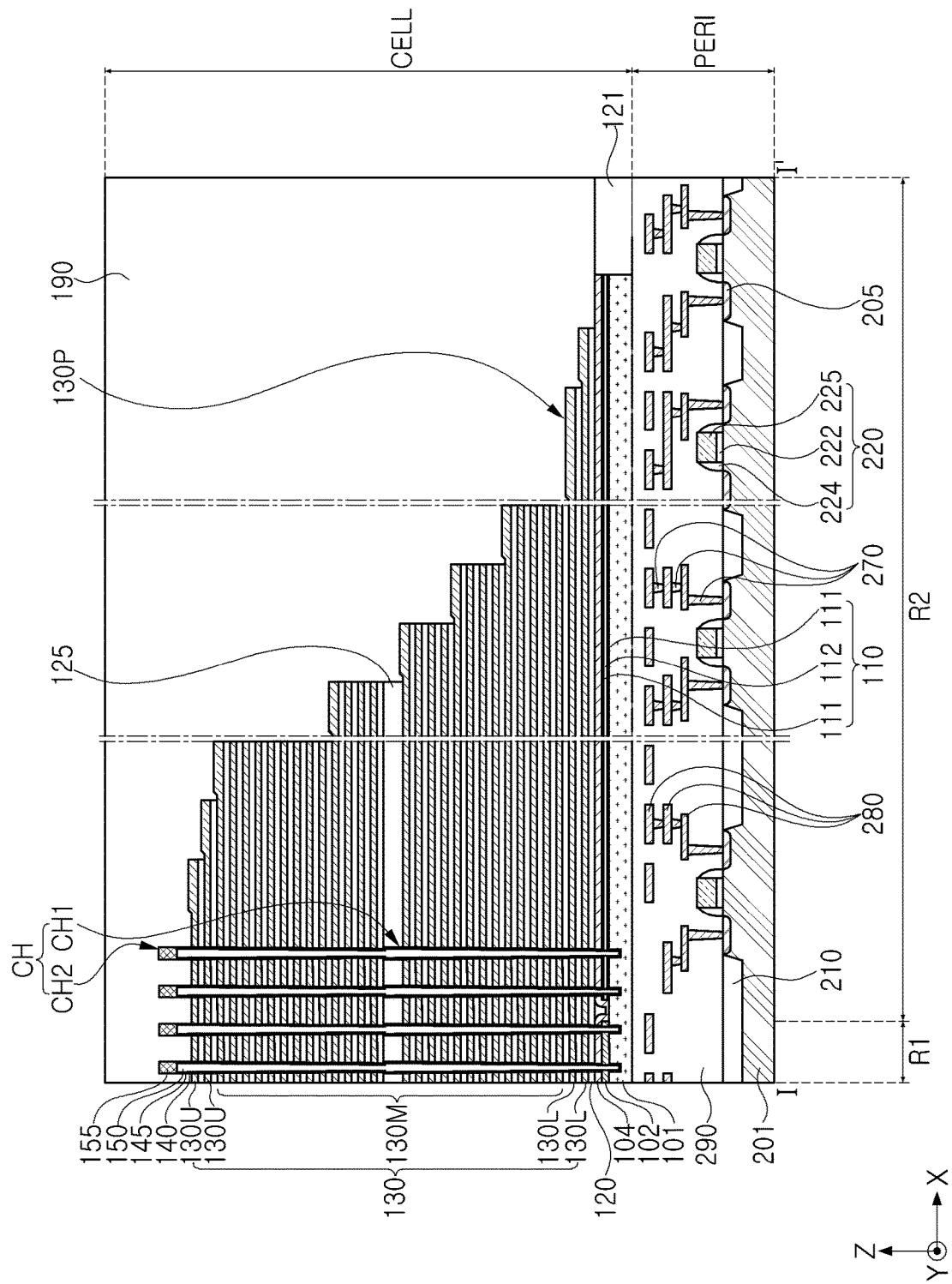
Figure 14B:
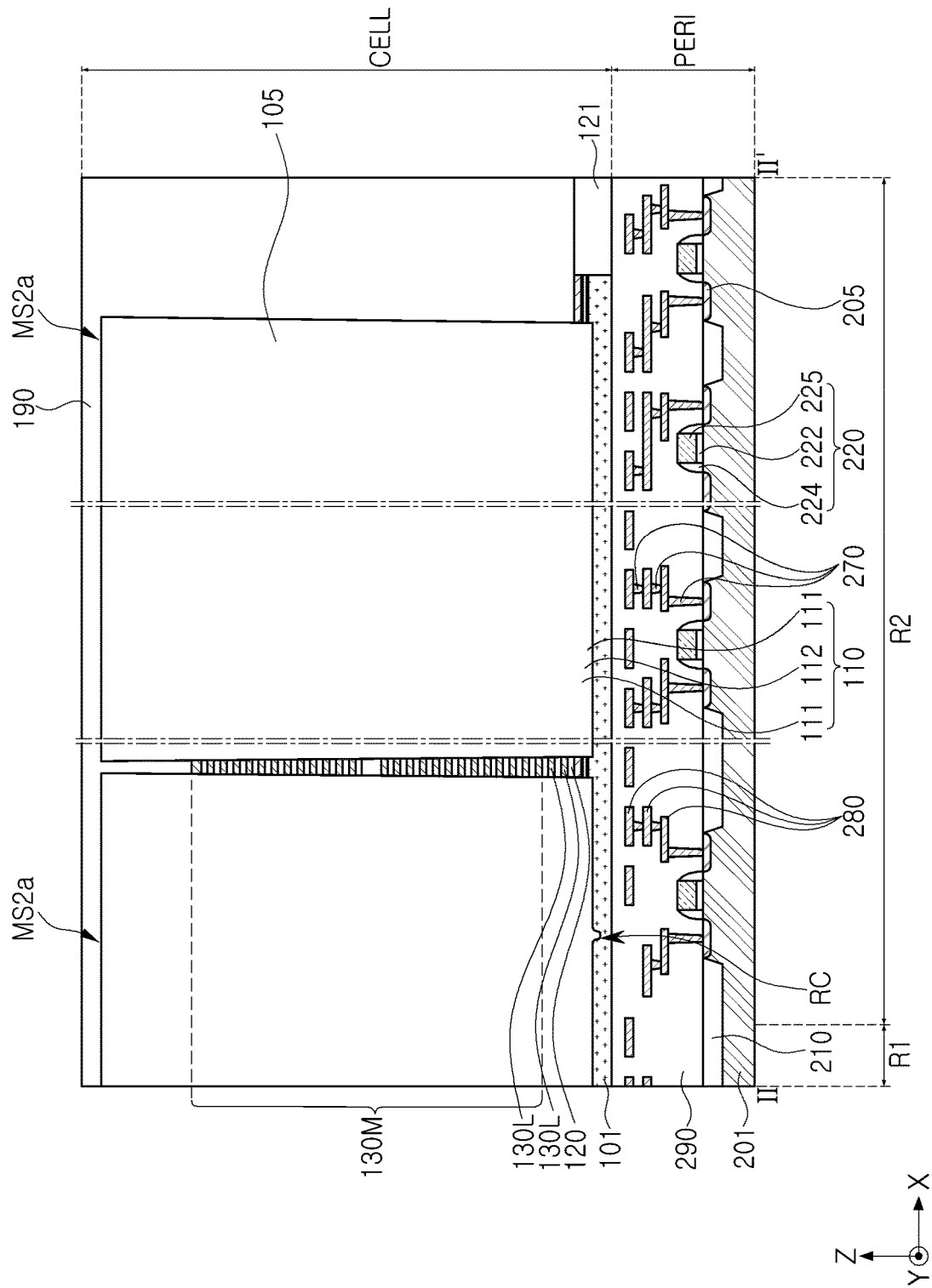

Referring to FIGS. 14A and 14B, the gate electrodes 130 may be formed in the tunnel portions TL, and the isolation insulating layer 105 may be formed in the openings OP.

The gate electrodes 130 may be formed in the tunnel portions TL from which the sacrificial insulating layers 118 have been removed. When a portion of the gate dielectric layer 145 extends horizontally along the gate electrodes 130, a portion of the gate dielectric layer 145 may be formed before the gate electrodes 130 in this stage. A conductive material of the gate electrodes 130 may include, for example, a metal, polycrystalline silicon, or a metal silicide material.

After the gate electrodes 130 are formed, the isolation insulating layer 105 may be formed in the openings OP formed in the regions of the first and second separation regions MS1, MS2a, and MS2b. The isolation insulating layer 105 may be formed to fill or at least partially fill the recess region RC.

Next, referring to FIGS. 2A and 2B together, the contact plugs 170 connected to the gate electrodes 130 may be formed, and the upper interconnections 185 may be further formed to manufacturing the semiconductor device 100.

Figure 15:
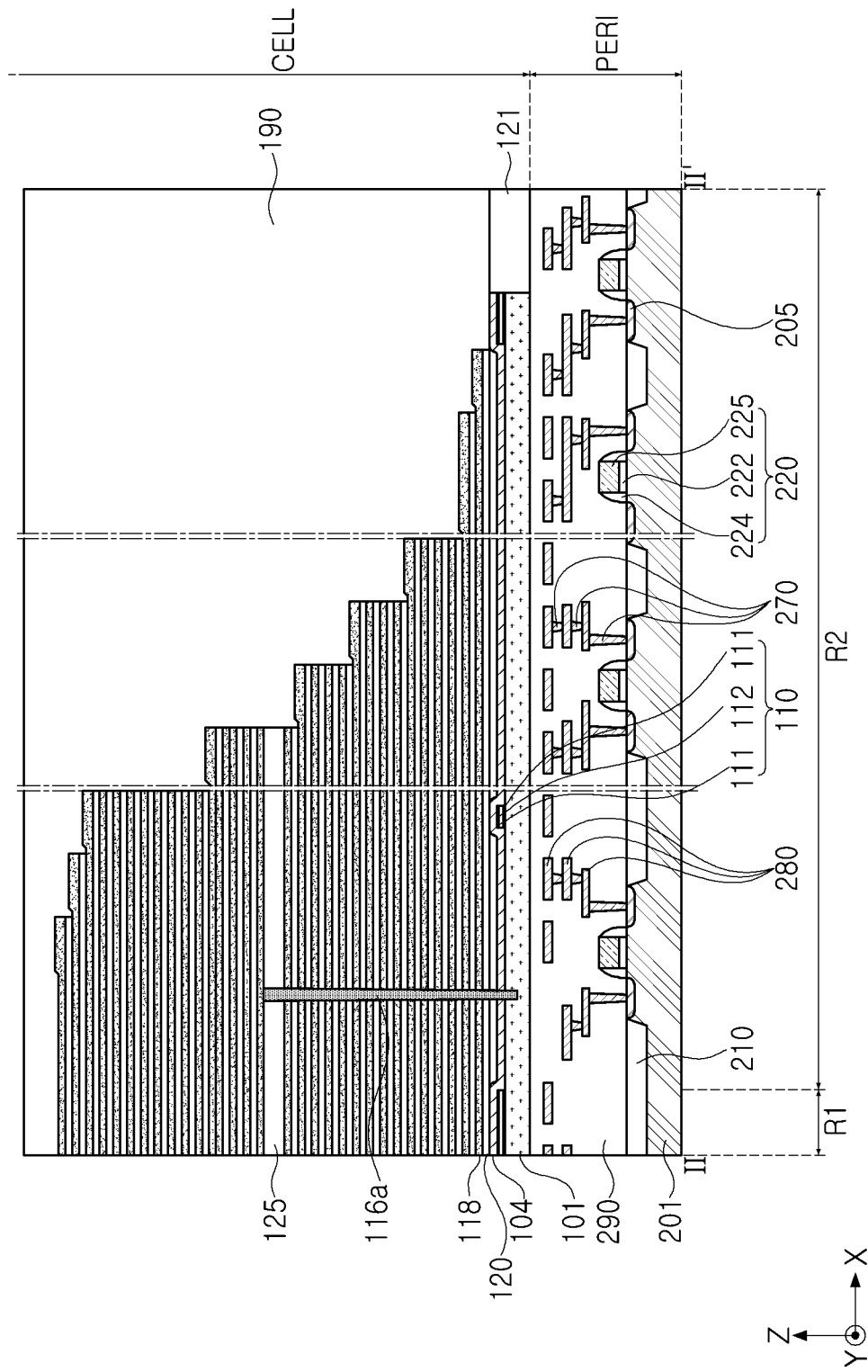
FIG. 15 is a schematic cross-sectional view illustrating a method of manufacturing a semiconductor device according to example embodiments.

FIG. 15 is a schematic cross-sectional view illustrating a method of manufacturing a semiconductor device according to example embodiments. FIG. 15 illustrates a region corresponding to FIG. 2B.

Referring to FIG. 15, in the step described above with reference to FIGS. 10A and 10B, the second vertical sacrificial layer 116a may be formed on the first vertical sacrificial layer 116a in a region corresponding to the recess region RC (refer to FIG. 2B). The first vertical sacrificial layer 116a may disperse an electric field when the openings OP described above with reference to FIG. 12 are formed, and may be removed as the openings OP are formed.

In some embodiments, in the final semiconductor device, the recess region RC may be formed to have a relatively low depth or may not be formed, compared to the embodiments described above with reference to FIGS. 10A and 10B.

Figure 16:
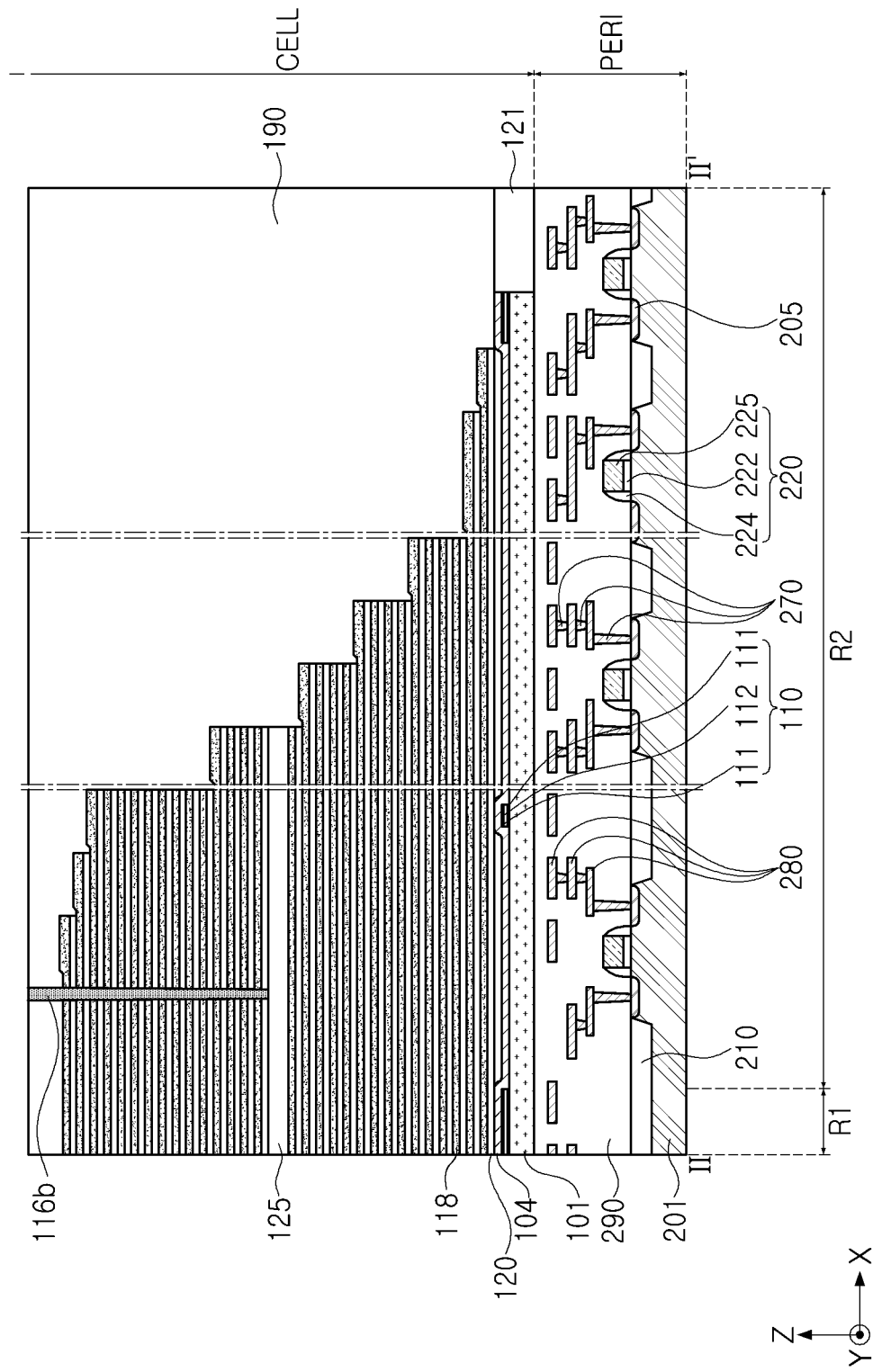
FIG. 16 is a schematic cross-sectional view illustrating a method of manufacturing a semiconductor device according to example embodiments.

FIG. 16 is a schematic cross-sectional view illustrating a method of manufacturing a semiconductor device according to example embodiments. FIG. 15 illustrates a region corresponding to FIG. 2B.

Referring to FIG. 16, in the step described above with reference to FIGS. 9A and 9B, the first vertical sacrificial layer 116a may not be formed on the region corresponding to the recess region RC (refer to FIG. 2B). In addition, in the step described above with reference to FIGS. 10A and 10B, the second vertical sacrificial layer 116b may be formed on the lower stack structure in a region corresponding to the recess region RC. The second vertical sacrificial layer 116b may be substituted to have an internal structure corresponding to the channel structure CH in the step described above with reference to FIGS. 11A and 11B. Thereafter, the substituted structure may disperse an electric field when the openings OP described above with reference to FIG. 12 are formed, and may be removed as the openings OP are formed.

In some embodiments, in the final semiconductor device, the recess region RC may be formed to have a relatively low depth or may not be formed, compared to the embodiments described above with reference to FIGS. 10A and 10B.

Figure 17:
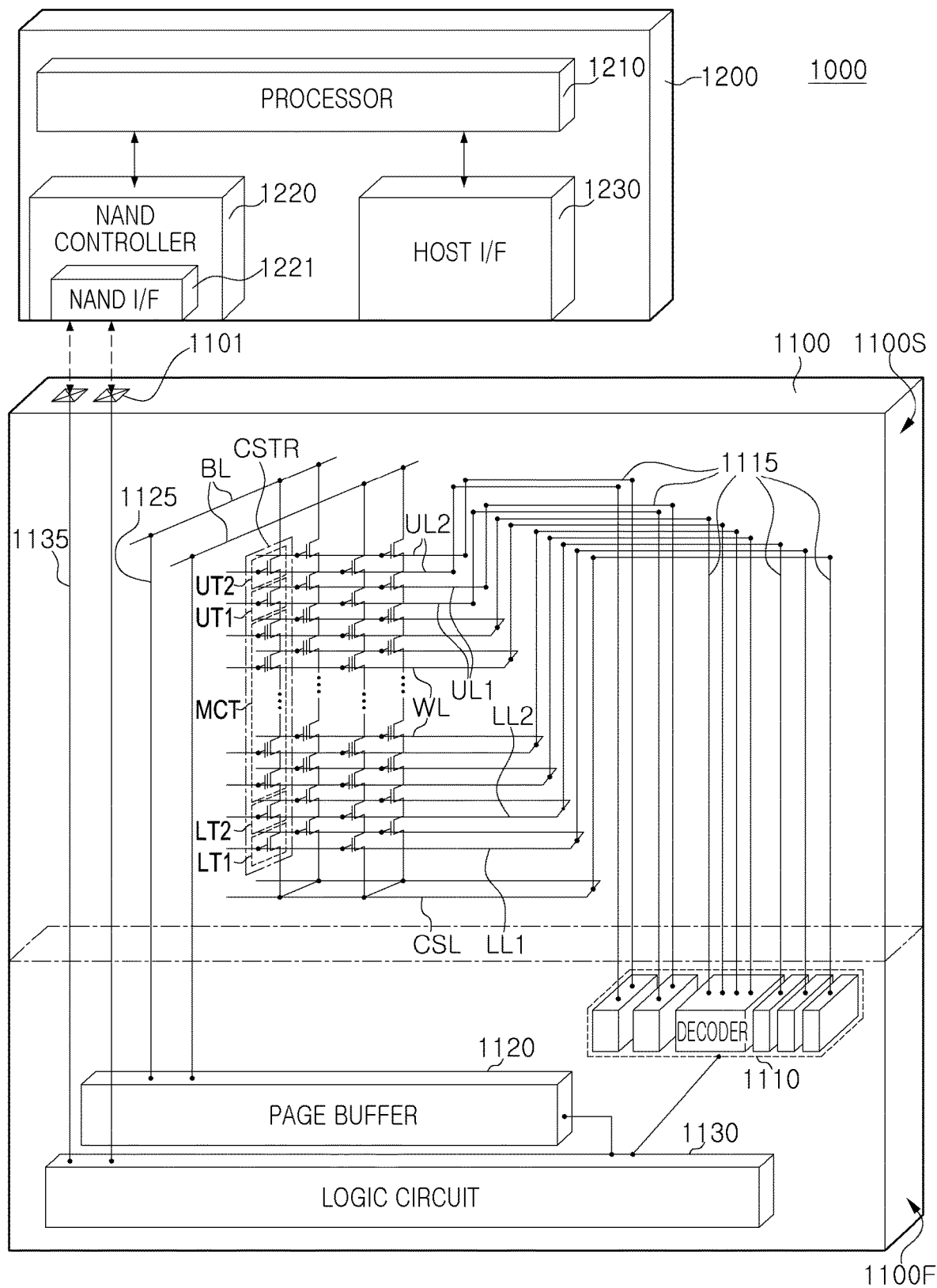
FIG. 17 is a view schematically illustrating a data storage system including a semiconductor device according to example embodiments.

FIG. 17 is a diagram schematically illustrating a data storage system including a semiconductor device according to example embodiments.

Referring to FIG. 17, a data storage system 1000 may include a semiconductor device 1100 and a controller 1200 electrically connected to the semiconductor device 1100. The data storage system 1000 may be a storage device including one or a plurality of semiconductor devices 1100 or an electronic device including a storage device. For example, the data storage system 1000 may be a solid state drive (SSD) device, a universal serial bus (USB), a computing system, a medical device, or a communication device including one or a plurality of semiconductor devices 1100.

The semiconductor device 1100 may be a nonvolatile memory device and may be, for example, the NAND flash memory device described above with reference to FIGS. 1 to 7. The semiconductor device 1100 may include a first structure 1100F and a second structure 1100S on the first structure 1100F. In example embodiments, the first structure 1100F may be disposed next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second gate upper lines UL1 and UL2, and memory cell strings CSTR between the bit line BL and the common source line CSL.

In the second structure 1100S, each of the memory cell strings CSTR may include lower transistors LT1 and LT2 adjacent to the common source line CSL, and upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously changed according to some embodiments.

In example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected the decoder circuit 1110 through first connection wirings 1115 extending from within the first structure 1100F to the second structure 1100S. The bit lines BL may be electrically connected to the page buffer 1120 through second connection lines 1125 extending from within the first structure 1100F to the second structure 1100S.

In the first structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an I/O pad 1101 electrically connected to the logic circuit 1130. The I/O pad 1101 may be electrically connected to the logic circuit 1130 through an I/O connection line 1135 extending from within the first structure 1100F to the second structure 1100S.

The controller 1200 may include a processor 1210, a NAND controller 1220, and a host interface (I/F) 1230. In some embodiments, the data storage system 1000 may include a plurality of semiconductor devices 1100, and in this case, the controller 1200 may control the plurality of semiconductor devices 1100.

The processor 1210 may control an overall operation of the data storage system 1000 including the controller 1200. The processor 1210 may operate according to predetermined firmware, and may access the semiconductor device 1100 by controlling the NAND controller 1220. The NAND controller 1220 may include a NAND I/F 1221 that handles communication with the semiconductor device 1100. Through the NAND I/F 1221, a control command for controlling the semiconductor device 1100, data to be written to the memory cell transistors MCT of the semiconductor device 1100, and data to be read from the memory cell transistors of the semiconductor device 1100 may be transmitted. The host I/F 1230 may provide a communication function between the data storage system 1000 and an external host. When a control command is received from an external host through the host I/F 1230, the processor 1210 may control the semiconductor device 1100 in response to the control command.

Figure 18:
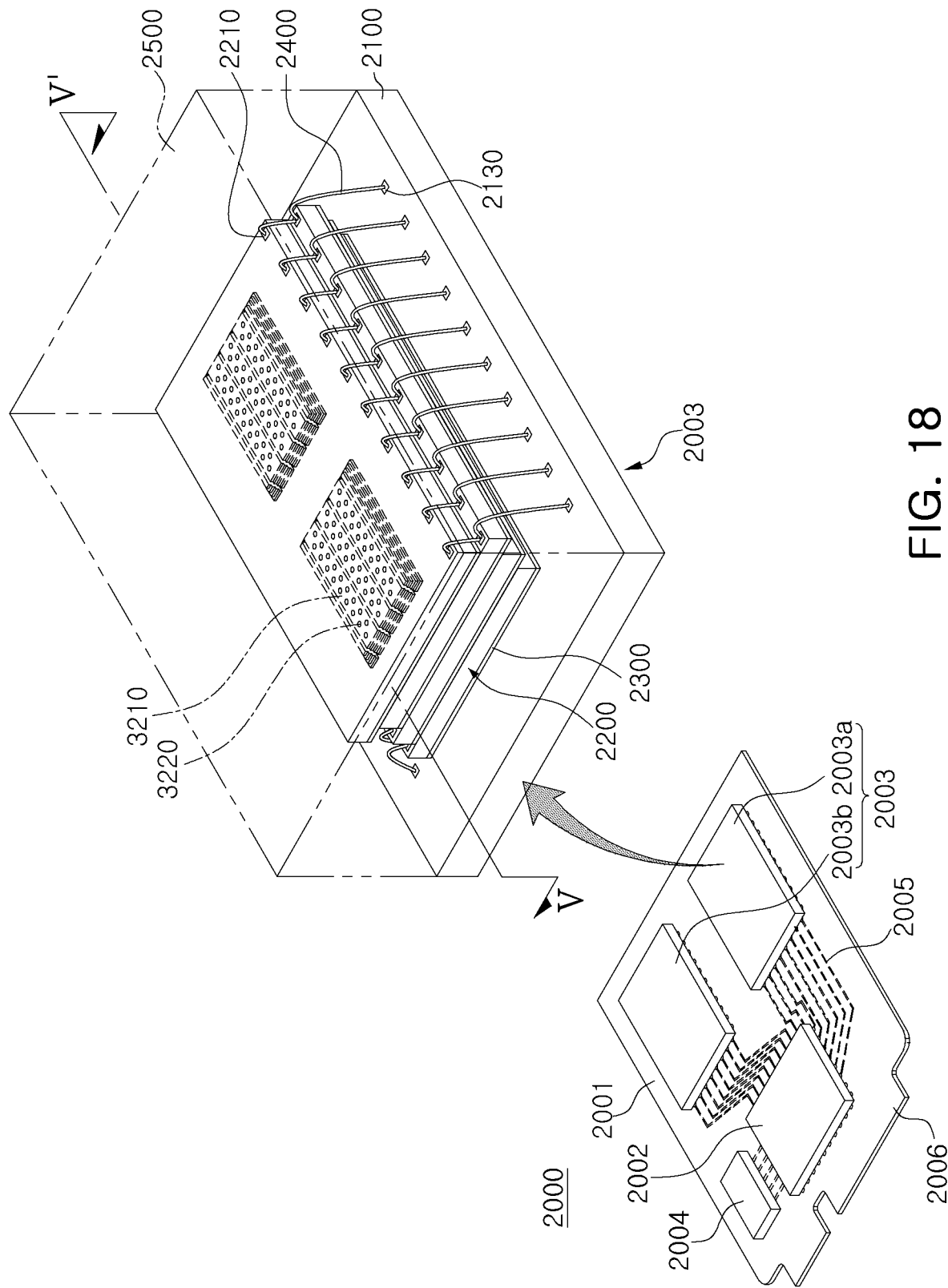
FIG. 18 is a perspective view schematically illustrating a data storage system including a semiconductor device according to example embodiments.

FIG. 18 is a schematic perspective view of a data storage system including a semiconductor device according to example embodiments.

Referring to FIG. 18, a data storage system 2000 according to example embodiments of the present inventive concept may include a main board 2001, a controller 2002 mounted on the main board 2001, one or more semiconductor packages 2003, and DRAM 2004. The semiconductor package 2003 and the DRAM 2004 may be connected to the controller 2002 by wiring patterns 2005 formed on the main board 2001.

The main board 2001 may include a connector 2006 including a plurality of pins coupled to an external host. The number and arrangement of the plurality of pins in the connector 2006 may vary depending on a communication interface between the data storage system 2000 and the external host. In example embodiments, the data storage system 2000 may communicate with the external host according to any one of interfaces such as a universal serial bus (USB), a peripheral component interconnect express (PCI-Express), serial advanced technology attachment (SATA), an M-Phy for universal flash storage (UFS), etc. In example embodiments, the data storage system 2000 may operate by power supplied from the external host through the connector 2006. The data storage system 2000 may further include a power management integrated circuit (PMIC) for distributing power supplied from the external host to the controller 2002 and the semiconductor package 2003.

The controller 2002 may write data to or read data from the semiconductor package 2003, and may improve an operating speed of the data storage system 2000.

The DRAM 2004 may be a buffer memory for mitigating a speed difference between the semiconductor package 2003 as a data storage space and the external host. The DRAM 2004 included in the data storage system 2000 may operate as a kind of cache memory, and may provide a space for temporarily storing data in a control operation on the semiconductor package 2003. When the data storage system 2000 may include the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering or overlapping the semiconductor chips 2200 and the connection structure 2400 on the package substrate 2100.

The package substrate 2100 may be a printed circuit board including package upper pads 2130. Each semiconductor chip 2200 may include an I/O pad 2210. The I/O pad 2210 may correspond to the I/O pad 1101 of FIG. 17. Each of the semiconductor chips 2200 may include gate stack structures 3210 and channel structures 3220. Each of the semiconductor chips 2200 may include the semiconductor device described above with reference to FIGS. 1 to 7.

In example embodiments, the connection structure 2400 may be a bonding wire electrically connecting the I/O pad 2210 to the package upper pads 2130. Accordingly, in each of the first and second semiconductor packages 2003*a* and 2003*b*, the semiconductor chips 2200 may be electrically connected to each other by a bonding wire method, and may be electrically connected to the package upper pads 2130 of the package substrate 2100. According to embodiments, in each of the first and second semiconductor packages 2003*a* and 2003*b*, the semiconductor chips 2200 may be electrically connected to each other by a connection structure including a through-electrode (through silicon via (TSV)) instead of the bonding wire-type connection structure 2400.

In example embodiments, the controller 2002 and the semiconductor chips 2200 may be included in one package. In example embodiments, the controller 2002 and the semiconductor chips 2200 may be mounted on a separate interposer substrate different from the main board 2001, and the controller 2002 and the semiconductor chips 2200 may be connected to each other by a wiring formed on the interposer substrate.

Figure 19:
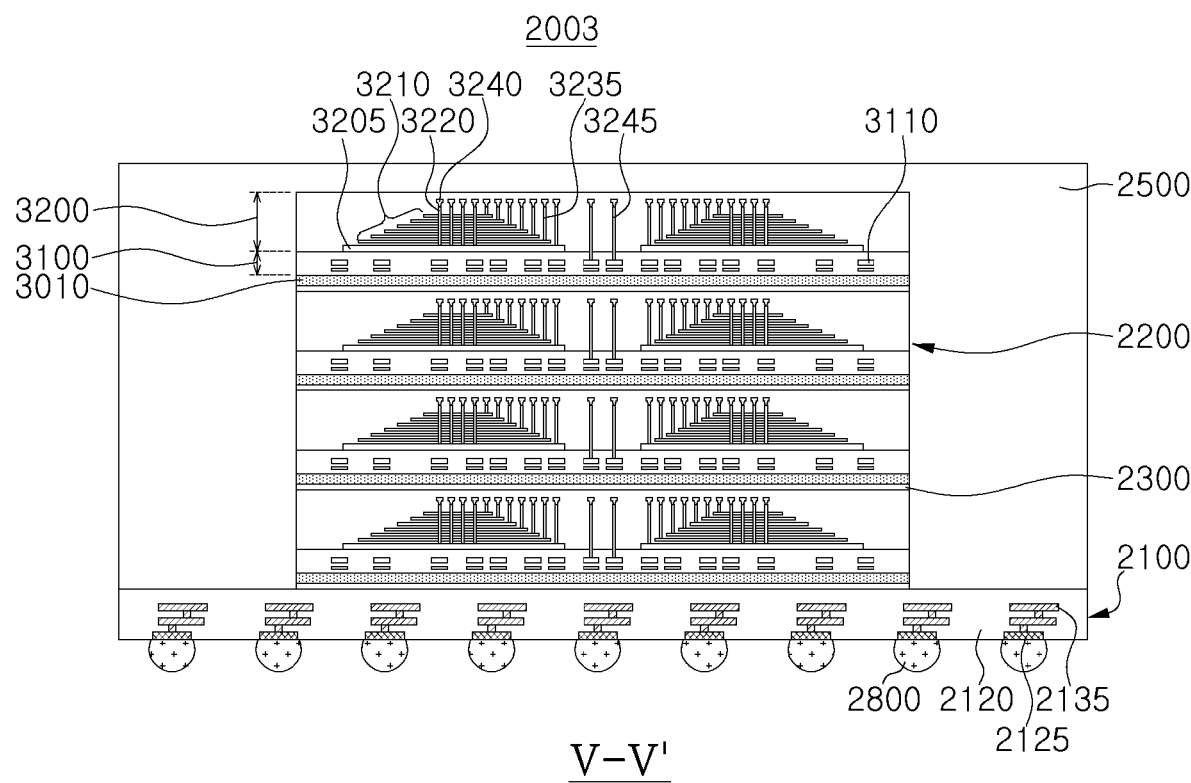
FIG. 19 is a cross-sectional view schematically illustrating a semiconductor package according to example embodiments.

FIG. 19 is a cross-sectional view schematically illustrating a semiconductor package according to example embodiments. FIG. 19 illustrates example embodiments of the semiconductor package 2003 of FIG. 18, and conceptually illustrates a region of the semiconductor package 2003 of FIG. 18, taken along line V-V'.

Referring to FIG. 19, in the semiconductor package 2003, the package substrate 2100 may be a printed circuit board. The package substrate 2100 may include a package substrate body portion 2120, package upper pads 2130 (refer to FIG. 19) disposed on an upper surface of the package substrate body portion 2120, lower pads 2125 disposed on a lower surface of the package substrate body portion 2120 or exposed through the lower surface of the package substrate body portion 2120, and internal wirings 2135 electrically connecting the package upper pads 2130 and the lower pads 2125 to each other in the package substrate body portion 2120. The package upper pads 2130 may be electrically connected to connection structures 2400. The lower pads 2125 may be connected to wiring patterns 2005 of the main board 2010 of the data storage system 2000 as shown in FIG. 18 through conductive connectors 2800.

Each of the semiconductor chips 2200 may include a semiconductor substrate 3010 and a first structure 3100 and a second structure 3200 sequentially stacked on the semiconductor substrate 3010. The first structure 3100 may include a peripheral circuit region including peripheral wirings 3110. The second structure 3200 may include a common source line 3205, a gate stack structure 3210 on the common source line 3205, channel structures 3220 and separation regions 3230 penetrating through the gate stack structure 3210, bit lines 3240 electrically connected to the memory channel structures 3220, and contact plugs 3235 electrically connected to the word lines WL (refer to FIG. 17) of the gate stack structure 3210. As described above with reference to FIGS. 1 to 7, recess regions RC may be formed on an upper surface of the second substrate 101 in each of the semiconductor chips 2200.

Each of the semiconductor chips 2200 may include a through-wiring 3245 electrically connected to the peripheral wirings 3110 of the first structure 3100 and extending into the second structure 3200. The through-wiring 3245 may be disposed outside the gate stack structure 3210, and may be further disposed to penetrate through the gate stack structure 3210. Each of the semiconductor chips 2200 may further include an I/O pad 2210 (refer to FIG. 18) electrically connected to the peripheral wirings 3110 of the first structure 3100.

As set forth above, a semiconductor device having improved reliability and a data storage system including the same may be provided by forming a separation region after forming a channel structure in a region in which the separation region is to be formed during a manufacturing process.

Various and beneficial advantages and effects of the present inventive concept are not limited to the above, and will be more easily understood in the course of describing specific embodiments of the present inventive concept.

While example embodiments have been shown and described above, it will be apparent to those skilled in the art that modifications and variations could be made without departing from the scope of the present inventive concept as defined by the appended claims.

What may be claimed is:

1. A semiconductor device comprising:
a first semiconductor structure comprising a first substrate and circuit elements on the first substrate; and a second semiconductor structure on the first semiconductor structure,
wherein the second semiconductor structure comprises:
a second substrate having a first region and a second region;
gate electrodes that are stacked and spaced apart from each other in a first direction that is perpendicular to an upper surface of the second substrate, wherein the gate electrodes extend in a second direction on the second region and have different lengths on the second region;
channel structures that penetrate the gate electrodes and extend in the first direction, wherein each of the channel structures comprises a conductive channel layer, and wherein the channel structures are on the first region;
support structures that penetrate the gate electrodes and extend in the first direction, wherein each of the support structures comprises a support insulating layer, and wherein the support structures are on the second region;
separation regions that penetrate the gate electrodes, extend in the second direction, and are spaced apart from each other in a third direction that is perpendicular to the first direction and the second direction;
a first horizontal conductive layer on the first region below the gate electrodes, wherein the first horizontal conductive layer is in contact with the channel layer of each of the channel structures; and
a horizontal insulating layer below the gate electrodes on a portion of the second region,
wherein the second substrate has recess regions below the separation regions in the second region, adjacent to the first region.

2. The semiconductor device of claim 1, wherein the separation regions have protrusions corresponding to the recess regions and extending into the second substrate.

3. The semiconductor device of claim 2, wherein respective depths of the protrusions range from about 70 nm to about 150 nm.

4. The semiconductor device of claim 1, wherein the second semiconductor structure further comprises a second horizontal conductive layer on the first horizontal conductive layer and the horizontal insulating layer.

5. The semiconductor device of claim 4,
wherein the separation regions penetrate the first horizontal conductive layer, the second horizontal conductive layer, and the horizontal insulating layer, and
wherein lower surfaces of the separation regions are in contact with the second substrate.

6. The semiconductor device of claim 1, wherein the second semiconductor structure further comprises a dummy structure in at least one of the recess regions and comprises a portion of the channel layer.

7. The semiconductor device of claim 6, wherein a level of an upper surface of the dummy structure is lower than a lower surface of a lowermost gate electrode among the gate electrodes.

8. The semiconductor device of claim 1, wherein the recess regions are in a region between the channel structures and the support structures in the second direction.

9. The semiconductor device of claim 1, wherein the recess regions entirely overlap the separation regions.

10. The semiconductor device of claim 1, wherein a level of a lower end of the recess regions is at a same level as or at a lower level than a respective lower end of the channel structures.

11. The semiconductor device of claim 1, wherein the recess regions are spaced apart from the first horizontal conductive layer.

12. The semiconductor device of claim 1,
wherein respective widths of the channel structures are less than respective widths of the support structures, and
wherein respective widths of the recess regions are less than the respective widths of the support structures.

13. The semiconductor device of claim 1, wherein a plurality of the recess regions are below each of the separation regions.

14. The semiconductor device of claim 1, wherein respective widths of the recess regions in the second direction are greater than respective widths of the recess regions in the third direction.

15. The semiconductor device of claim 1,
wherein the channel structures and the support structures have different internal structures,
wherein the channel structures comprise a conductive layer that is not included in the support structures, and
wherein the support structures comprise the support insulating layer that is not included in the channel structures.

16. A semiconductor device comprising:
a substrate having a first region and a second region;
gate electrodes that are stacked and spaced apart from each other in a first direction that is perpendicular to an upper surface of the substrate, wherein the gate electrodes extend in a second direction on the second region and have different lengths on the second region;
channel structures that penetrate the gate electrodes and extend in the first direction, wherein each of the channel structures comprises a channel layer, and wherein the channel structures are on the first region;
support structures that penetrate the gate electrodes and extend in the first direction, where in the support structures are on the second region; and
a separation region that penetrates the gate electrodes and extends in the second direction,
wherein the substrate comprises a recess region that overlaps the separation region in the first direction and extends downward from the upper surface in the second region, and
wherein the separation region has a protrusion that protrudes downward towards the recess region.

17. The semiconductor device of claim 16, wherein the recess region has a shape corresponding to a shape of a corresponding one of the channel structures in a plane parallel to the upper surface of the substrate.

18. The semiconductor device of claim 16, wherein the channel structures comprise a conductive material and the support structures do not include a conductive material.

19. A data storage system comprising:
a semiconductor storage device comprising a substrate having a first region and a second region, circuit elements on a side of the substrate, and an input/output (I/O) pad electrically connected to the circuit elements; and
a controller electrically connected to the semiconductor storage device through the I/O pad and configured to control the semiconductor storage device,
wherein the semiconductor storage device further comprises:
gate electrodes that are stacked and spaced apart from each other in a first direction that is perpendicular to an upper surface of the substrate, wherein the gate electrodes extend in a second direction on the second region and have different lengths on the second region;

channel structures that penetrate the gate electrodes and extend in the first direction, wherein each of the channel structures comprises a channel layer, and wherein the channel structures are on the first region;

support structures that penetrate the gate electrodes and extend in the first direction, wherein the support structures are on the second region; and a separation region that penetrates the gate electrodes and extends in the second direction, wherein the substrate comprises a recess region that overlaps the separation region in the first direction and extends downward from the upper surface of the substrate in the second region, and wherein the separation region comprises a protrusion that protrudes downward towards the recess region.

20. The data storage system of claim 19, wherein the recess region is in a region between the channel structures and the support structures in the second direction.

* * * * *